US010451700B2

(12) United States Patent
Weingartner et al.

(10) Patent No.: US 10,451,700 B2
(45) Date of Patent: Oct. 22, 2019

(54) SYSTEM AND METHOD FOR REDUCING PARTIAL VOLUMING ARTIFACTS IN QUANTITATIVE MYOCARDIAL TISSUE CHARACTERIZATION

(71) Applicant: REGENTS OF THE UNIVERSITY OF MINNESOTA, Minneapolis, MN (US)

(72) Inventors: Sebastian Weingartner, Heidelberg (DE); Mehmet Akcakaya, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 238 days.

(21) Appl. No.: 15/695,259

(22) Filed: Sep. 5, 2017

(65) Prior Publication Data

US 2018/0067184 A1 Mar. 8, 2018

Related U.S. Application Data

(60) Provisional application No. 62/385,110, filed on Sep. 8, 2016.

(51) Int. Cl.
*G01R 33/565* (2006.01)
*G01R 33/56* (2006.01)
*G01R 33/561* (2006.01)

(52) U.S. Cl.
CPC ... *G01R 33/56545* (2013.01); *G01R 33/5602* (2013.01); *G01R 33/5607* (2013.01); *G01R 33/5614* (2013.01)

(58) Field of Classification Search
CPC .......... G01R 33/56545; G01R 33/5602; G01R 33/5614; G01R 33/5607
See application file for complete search history.

(56) References Cited

U.S. PATENT DOCUMENTS 7,627,359 B2 * 12/2009 Yarnykh ............ G01R 33/5607
324/307
7,715,900 B2 * 5/2010 Yarnykh ............ G01R 33/5607
324/307

(Continued)

OTHER PUBLICATIONS

Coolen et al. "Three-dimensional T1 mapping of the mouse heart using variable flip angle steady-state MR imaging" NMR Biomed. 2011; 24: pp. 154-162.

(Continued)

*Primary Examiner* — Dixomara Vargas
(74) *Attorney, Agent, or Firm* — Quarles & Brady LLP

(57) ABSTRACT

A system and method for obtaining magnetic resonance images are provided. The system is programmed to control the RF system to apply a saturation pulse at a reference frequency that saturates a selected labile spin species of the subject. The system is programmed to control the RF system to apply an inversion pulse after a variable delay. The system is programmed to control the RF system and the plurality of gradient coils to apply a motion sensitized driven equilibrium (MSDE) preparation pulse. The system is programmed to control the plurality of gradient coils to read imaging data during an acquisition time period. The system is programmed to reconstruct a $T_1$ mapping image of the subject with black-blood contrast.

20 Claims, 20 Drawing Sheets

(56) References Cited

U.S. PATENT DOCUMENTS

| | | | |
|---|---|---|---|
| 9,041,393 B2* | 5/2015 | Warntjes | G01R 33/5602 324/307 |
| 9,554,727 B2* | 1/2017 | Li | |
| 2004/0133098 A1* | 7/2004 | Yarnykh | G01R 33/5607 600/419 |
| 2006/0184002 A1* | 8/2006 | Yarnykh | G01R 33/5607 600/410 |
| 2011/0018537 A1* | 1/2011 | Warntjes | G01R 33/5602 324/309 |
| 2014/0200436 A1 | 7/2014 | Weingärtner et al. | |
| 2018/0353139 A1* | 12/2018 | Speier | A61B 5/7285 |

OTHER PUBLICATIONS

Heng et al. "Pilot data of right ventricular myocardial T1 quantification by free-breathing fat-water separated dark blood saturation-recovery imaging" Journal of Cardiovascular Magnetic Resonance 2015, 17(Suppl 1):Q23, pp. 1-2. http://www.jcmr-online.com/content/17/S1/Q23.

Weingärtner et al. "Combined Saturation/Inversion Recovery Sequences for Improved Evaluation of Scar and Diffuse Fibrosis in Patients with Arrhythmia or Heart Rate Variability" Magnetic Resonance in Medicine (2013), pp. 1-11.

Weingärtner et al. "Black-Blood T1 Mapping: Blood-Signal Suppression for Reduced Partial-Voluming in the Myocardium" Conference abstract at the 2015 Annual Meeting of the European Society for Magnetic Resonance in Medicine, Edinburgh, Jan. 10, 2015, ESMRMB Congress 2015, pp. S75-S76.

Weingärtner et al. "Black-Blood T1 Mapping: Blood Signal Suppression for Reduced Partial-Voluming in the Myocardium" Manuscript submitted to the Journal "Magnetic Resonance in Medicine" on May 13, 2016, pp. 1-33.

Weingärtner et al. "Black-Blood T1 Mapping at 3T: Reduced Partial-Voluming using Adiabatic MSDE Preparation" Oral presentation at the SCMR/ISMRM Co-Provided Workshop "Quantitative CMR: From Technique Development to Practical Implementation", Los Angeles, Jan. 27, 2016, 4 pages.

* cited by examiner

SUBJECT #2

SUBJECT #3

SYSTEM AND METHOD FOR REDUCING PARTIAL VOLUMING ARTIFACTS IN QUANTITATIVE MYOCARDIAL TISSUE CHARACTERIZATION

CROSS-REFERENCE

This application is based on, claims priority to, and incorporates herein by reference in its entirety, U.S. Provisional Application Ser. No. 62/385,110, filed Sep. 8, 2016.

STATEMENT REGARDING FEDERALLY SPONSORED RESEARCH

This invention was made with government support under R00HL111410 and P41EB015894 awarded by the National Institutes of Health. The government has certain rights in the invention.

FIELD

The present disclosure relates to magnetic resonance imaging (MRI) methods and systems. More particularly, the disclosure relates to a system and method for MRI methods and systems for reducing partial voluming artifacts, for example, in quantitative myocardial tissue characterization.

BACKGROUND

When a substance such as human tissue is subjected to a uniform magnetic field (polarizing field $B_0$), the individual magnetic moments of nuclei in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a roster scan-like pattern sometimes referred to as a "spin-warp", a "Fourier", a "rectilinear", or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered back-projection.

The excited spins induce an oscillating sine wave signal in a receiving coil. The frequency of this signal is near the Larmor frequency, and its initial amplitude, $A_0$, is determined by the magnitude of the transverse magnetic moment $M_t$. The amplitude, A, of the emitted NMR signal decays in an exponential fashion, as given by $T_2^*$. A decay constant, referred to as the "spin-spin relaxation" constant or the "transverse relaxation" constant and given the representation "$T_2$," is inversely proportional to the exponential rate at which the aligned precession of the spins would dephase after removal of the excitation signal $B_1$ in a perfectly homogeneous field. The practical value of the $T_2$ constant is that tissues have different $T_2$ values and this can be exploited as a means of enhancing the contrast between such tissues in the reconstructed images.

Another important factor that contributes to the amplitude A of the NMR signal is referred to as the "spin-lattice relaxation" constant that is characterized by the time constant "$T_1$." It describes the recovery of the net magnetic moment M to its equilibrium value along the axis of magnetic polarization (e.g., the z-direction). The $T_1$ time constant is generally longer than $T_2$, much longer in most substances of medical interest. As with the $T_2$ constant, the difference in $T_1$ between tissues can be exploited to provide image contrast.

In addition to using $T_1$ values and $T_2$ values as a means to develop tissue-distinguishing contrast in reconstructed images, $T_1$ values or $T_2$ values may be mapped to provide a spatially-resolved quantification of the latitudinal or longitudinal relaxation, respectively. These maps can provide further clinical insight. For example, assessment of diffuse fibrosis using myocardial $T_1$-mapping has promising clinical potential for therapy monitoring and risk stratification in diseases like dilated cardiomyopathy (DCM). For the quantitative comparison of $T_1$-values to healthy references, the reproducibility of $T_1$-mapping methods is paramount. As $T_1$ in blood is significantly higher than in the myocardium, major partial-voluming effects arise at myocardial borders, rendering the method sensitive to slice geometry and the choice of region-of-interest, impairing the inter-observer reproducibility, especially in the presence of reduced myocardial wall-thickness.

Thus, there is a need for systems and methods that can control the blood signal and partial-voluming effect in $T_1$-mapping.

SUMMARY

The present disclosure overcomes the aforementioned drawbacks by providing a system and method for reducing partial voluming artifacts in quantitative myocardial tissue characterization. In particular, the present disclosure provides a black-blood $T_1$ mapping method.

In accordance with one aspect of the disclosure, a magnetic resonance imaging (MRI) system is disclosed that includes a magnet system configured to generate a polarizing magnetic field about at least a region of interest (ROI) in a subject arranged in the MRI system, a plurality of gradient coils configured to apply a gradient field to the polarizing magnetic field, a radio frequency (RF) system configured to apply an excitation field to the subject and acquire MR image data from a ROI, and a computer system. The computer system is programmed to control the RF system to apply a saturation pulse at a reference frequency that saturates a selected labile spin species of the subject. The computer system is programmed to control the RF system to apply an inversion pulse after a variable delay. The computer system is programmed to control the RF system and the plurality of gradient coils to apply a motion sensitized driven equilibrium (MSDE) preparation pulse. The computer system is programmed to control the plurality of gradient coils to read imaging data during an acquisition time period. The computer system is programmed to reconstruct a T1 mapping image of the subject with black-blood contrast.

The foregoing and other advantages of the disclosure will appear from the following description.

DETAILED DESCRIPTION

Figure 1:
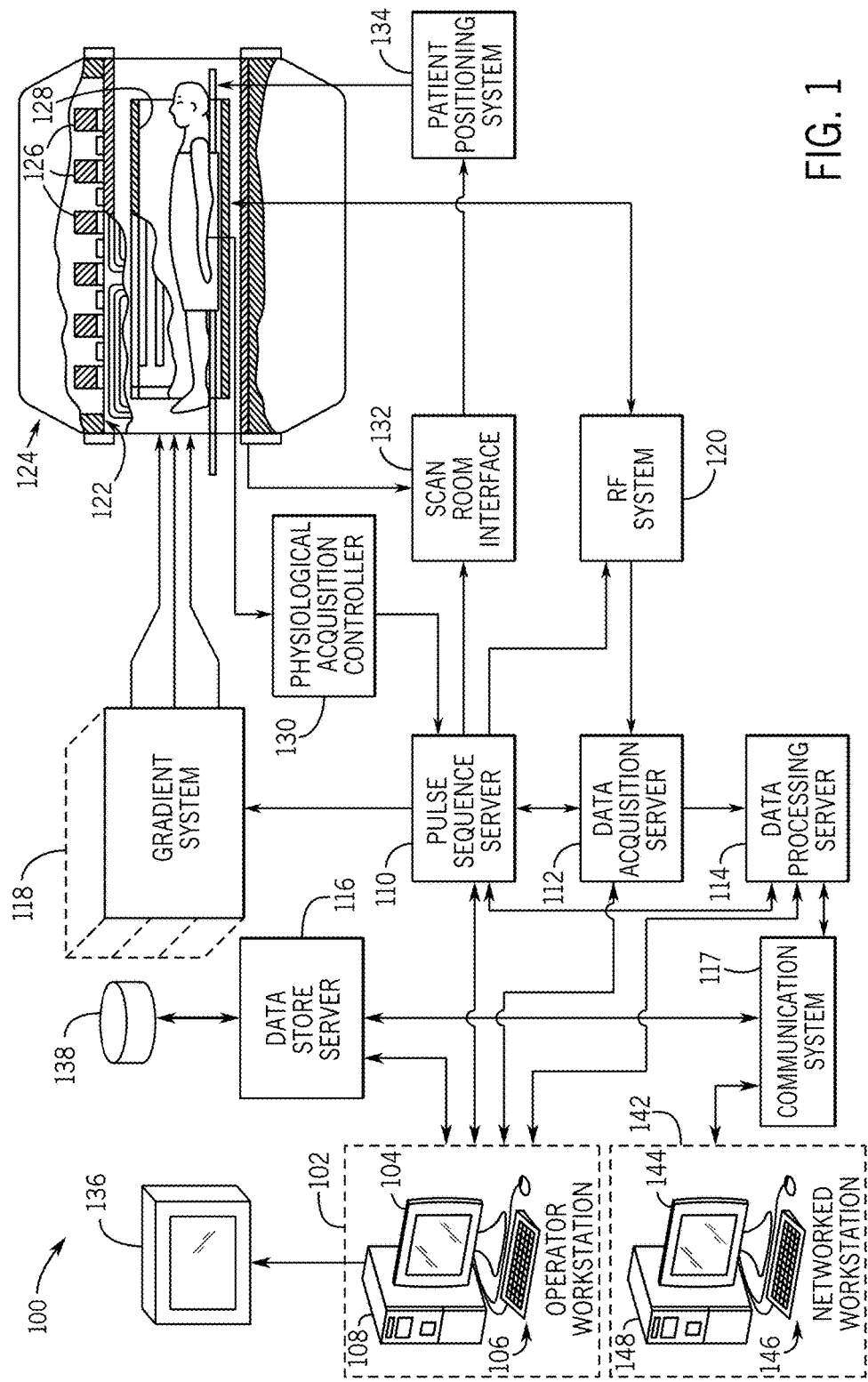
FIG. 1 is a block diagram of an MRI system which employs the present disclosure.

Referring particularly now to FIG. 1, an example of a magnetic resonance imaging (MRI) system 100 is illustrated that may be configured in accordance with the present disclosure. The MRI system 100 includes an operator workstation 102, which will typically include a display 104, one or more input devices 106, such as a keyboard and mouse, and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 117, which may include any suitable network connection, whether wired, wireless, or a combination of both. As an example, the communication system 117 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil (not shown in FIG. 1), are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays (not shown in FIG. 1).

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad \text{Eqn. 1;}$$

and the phase of the received magnetic resonance signal may also be determined according to the following relationship:

$$\varphi = \tan^{-1}\left(\frac{Q}{I}\right). \qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than passing the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 117. Accordingly, multiple networked workstations 142 may have access to the data processing server 114 and the data store server 116. In this manner, magnetic resonance data, reconstructed images, or other data may exchange between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

Quantitative tissue characterization of the myocardium using cardiac magnetic resonance imaging (CMR) is a promising diagnostic tool with clinical value in numerous cardiomyopathies. Recently, native myocardial $T_1$ mapping has also shown prognostic value in pathologies with reduced myocardial wall thickness, such as dilated cardiomyopathy (DCM). For example, myocardial $T_1$ mapping may be performed using a series of end-diastolic single-shot images acquired within a single breath-hold. Variable magnetization preparation of the single-shot images induces varying $T_1$ weighted contrast and enables voxel-wise $T_1$ quantification.

However, the limited duration of the diastolic quiescence requires rapid imaging and restricts the in-plane resolution. This leads to major partial-voluming effects at the myocardial-blood interface due to substantial differences in their respective $T_1$ times. Partial-voluming reduces the myocardial area that is suitable for quantitative evaluation, impairs the reproducibility, and hampers the depiction of thin structures.

Segmented acquisition of the $T_1$ weighted images has been proposed to mitigate this shortcoming by improving the in-plane resolution. Similarly, $T_1$ quantification at systole has been proposed to increase the number of voxels within the myocardium that are not subject to partial voluming. However, residual partial-voluming may still be expected even at higher resolutions or with increased myocardial wall thickness, especially in oblique orientations. Another approach to overcome this issue is blood-suppression. In-flow saturation at the great vessels may also be used to induce black-blood contrast in the pre-clinical mouse model.

In this disclosure, a black-blood $T_1$ mapping method is provided by using combined saturation and inversion recovery and MSDE magnetization preparation. Numerical simulations were performed to study the effects of blood-suppression on partial-voluming. Phantom scans and in-vivo experiments in healthy volunteers were carried out to optimize the black-blood imaging parameters and to evaluate the proposed method on efficient blood signal suppression and homogeneous $T_1$ quantification.

Figure 2A:
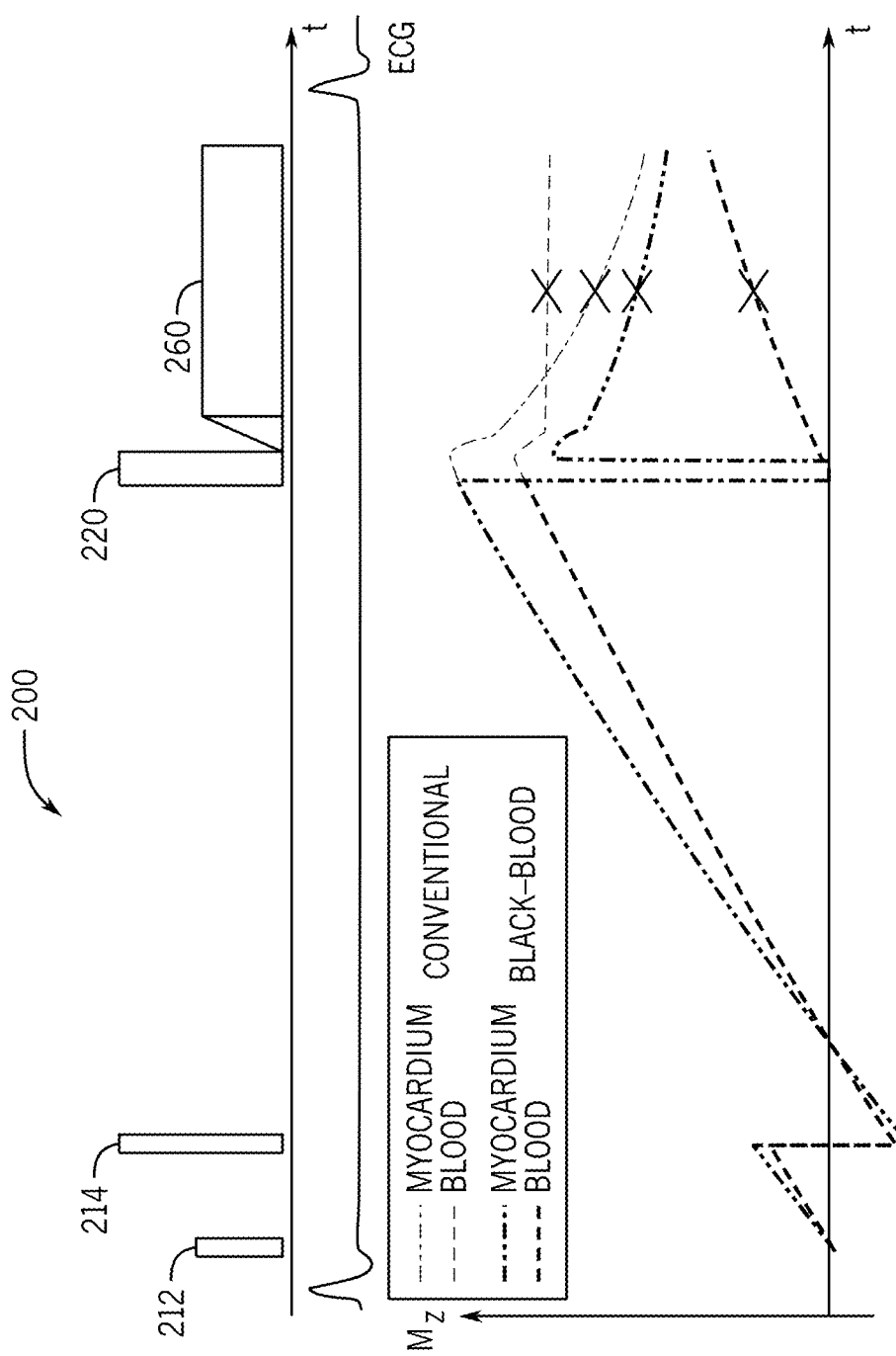
FIG. 2A is a graphic illustration of one pulse sequence for directing the MRI system of FIG. 1 to acquire spectral data in accordance with the present disclosure.

One non-limiting example of a pulse sequence in accordance with the present disclosure is provided in FIG. 2A. In particular, as will be described, FIG. 2A illustrates a modified SAPPHIRE pulse sequence 200 in accordance with the present disclosure. However, a variety of other pulse sequences may be used instead of SAPPHIRE. Other non-limiting examples include saturation recovery single-shot acquisition (SASHA), arrhythmia-insensitive rapid (AIR) $T_1$ mapping sequence, and other saturation recovery techniques. Also, inversion recovery techniques may be modified for use with the present disclosure, such as slice-interleaved $T_1$ (STONE) sequence.

Referring particularly to FIG. 2A, the sequence 200 includes a saturation pulse 212 followed by an inversion pulse 214. The saturation pulse 212 may be triggered by the ECG signal. For example, a saturation pulse is played at the detection of the R-wave followed by an inversion pulse after a variable delay. In the sequence 200, a MSDE preparation 220 is inserted directly before the balanced Steady-State Free-Precession (bSSFP) imaging readout 260.

Conventional SAPPHIRE consists of a saturation pulse followed by a non-selective inversion, creating only weak contrast between blood and myocardial signal, as indicated by the red crosses in FIG. 2A. To increase contrast, black blood is generated by the application of a motion-sensitized driven equilibrium (MSDE) preparation before the acquisition. The longitudinal magnetization is tipped with a 90° tip-down pulse and then dephased by motion-sensitized gradients. Static tissue refocuses after the application of an MLEV refocusing pulse, whereas moving blood signal is suppressed. The motion-sensitized signal is tipped back to the longitudinal axis, and remaining transverse magnetization is finally spoiled.

Figure 2B:
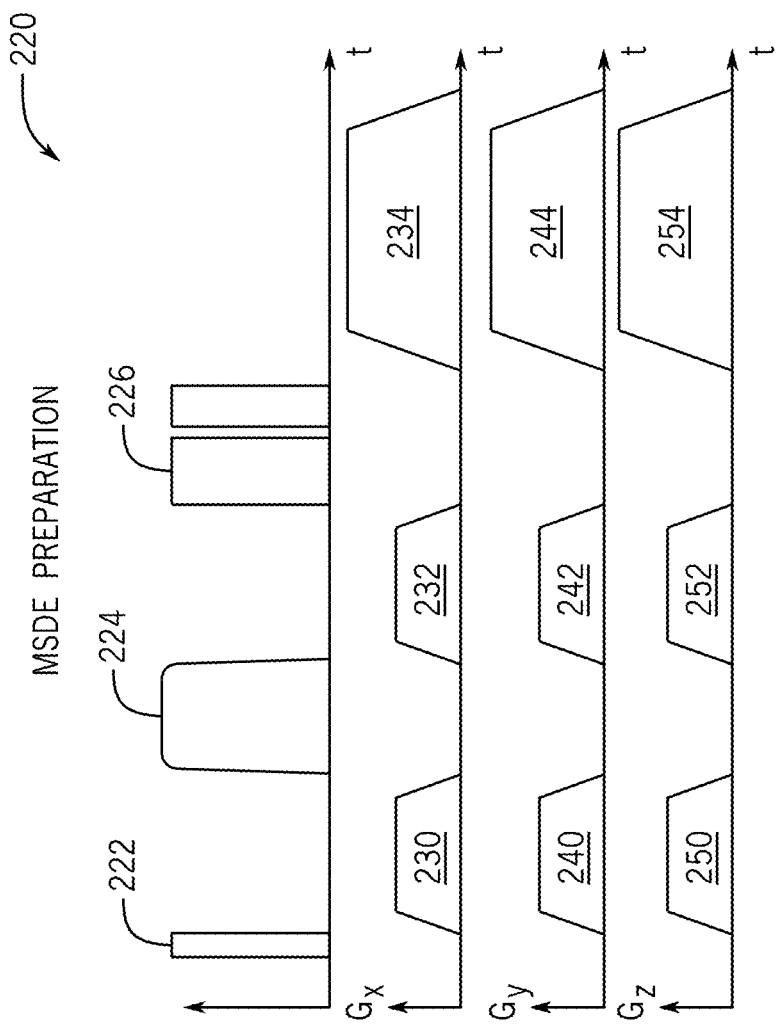
FIG. 2B is a graphic illustration of the MSDE pulse that may be used in the pulse sequence in accordance with the present disclosure.

FIG. 2B is a graphic illustration of the MSDE pulse that may be used in the pulse sequence in accordance with the present disclosure. In the MSDE preparation 220, a non-selective 90° tip-down pulse 222, a series of one or more 180° refocusing pulses 224, and a final 90° tip-up pulse 226 are used to encode the spin-dephasing in the longitudinal magnetization. A first pair of strong gradients 230 and 232 with identical gradient moments are placed on Gx before and after the refocusing pulses to induce dephasing of differentially moving tissue. A second pair of strong gradients 240 and 242 with identical gradient moments are placed on Gy before and after the refocusing pulses to induce dephasing of differentially moving tissue. A third pair of strong gradients 250 and 252 with identical gradient moments are placed on Gz before and after the refocusing pulses to induce dephasing of differentially moving tissue.

Additionally, there is one spoiler gradient 234 on Gx after applying the 90° tip-up pulse 226. There is one spoiler gradient 244 on Gy after applying the 90° tip-up pulse 226. There is one spoiler gradient 254 on Gz after applying the 90° tip-up pulse 226.

Figure 3:
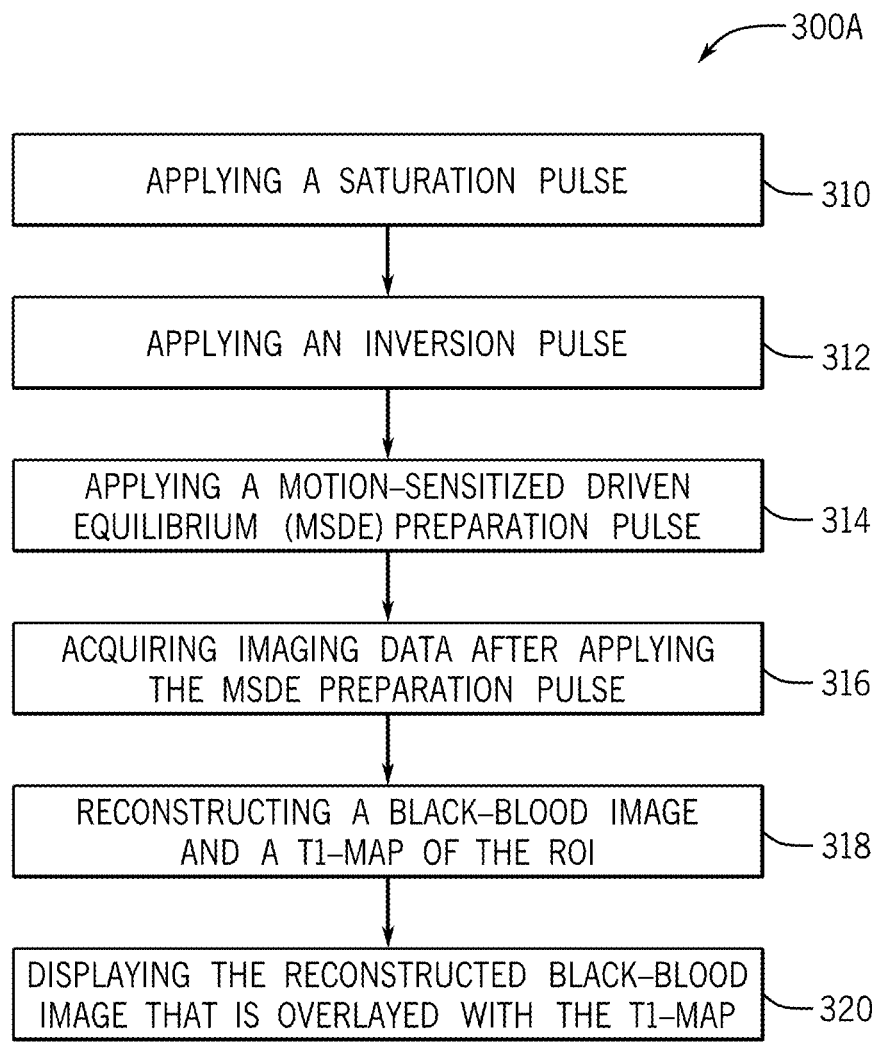
FIG. 3 is an example flow chart setting forth the steps of a method in accordance with the present disclosure.

FIG. 3 is an example flow chart setting forth the steps of a method 300A in accordance with the present disclosure. In step 310, a saturation pulse is applied. The saturation pulse may be applied during a saturation time period at a characteristic frequency or a range of frequency offsets that saturates the magnetization of a selected labile spin species of a subject. In step 312, the MRI system applies an inversion pulse. In step 314, the MRI system applies a motion sensitized driven equilibrium (MSDE) preparation pulse. The MRI system may apply the MSDE preparation pulse right before data acquisition. In step 316, the MRI system acquires imaging data in a region of interest (ROI). In step 318, the MRI system reconstructs a black-blood image and a $T_1$-map of the ROI. In step 320, the MRI system displays the reconstructed black-blood image that is overlayed with the $T_1$-map. The MRI system may display the images on a local displaying device connected to the MRI system directly. Alternatively or additionally, the MRI system may send the reconstructed images to a remote displaying device so that an expert may view the reconstructed images remotely.

Here, the MSDE implementation the black-blood gradients may be played out with all three gradient coils, a maximum gradient amplitude of 20 mT/m per coil and a slew-rate of 150 mT/m/ms (ramp durations of 0.14 ms). Motion-sensitizing gradient duration may be maximized within the gaps between the respective tip-up/-down and the refocusing pulse. The MSDE echo time may be fixed to $TE_{MSDE}=11$ ms, if not stated otherwise.

The sequence in FIG. 3 may also be referred to as Black-blood SAPPHIRE sequence in the disclosure. Here, the MRI system may further control the plurality of gradient coils to apply phase/frequency spatial encoding if needed. Numerical simulations were performed to study the effect of partial-voluming on the $T_1$ maps and phantom scans were performed to assess the $T_1$ time accuracy. In-vivo black-blood and conventional SAPPHIRE $T_1$ mapping was performed in eight healthy subjects and analyzed for $T_1$ times and precision. Manually drawn ROIs in all $T_1$ maps were dilated and eroded to analyze the dependence of septal $T_1$ times on the ROI thickness.

Figure 4:
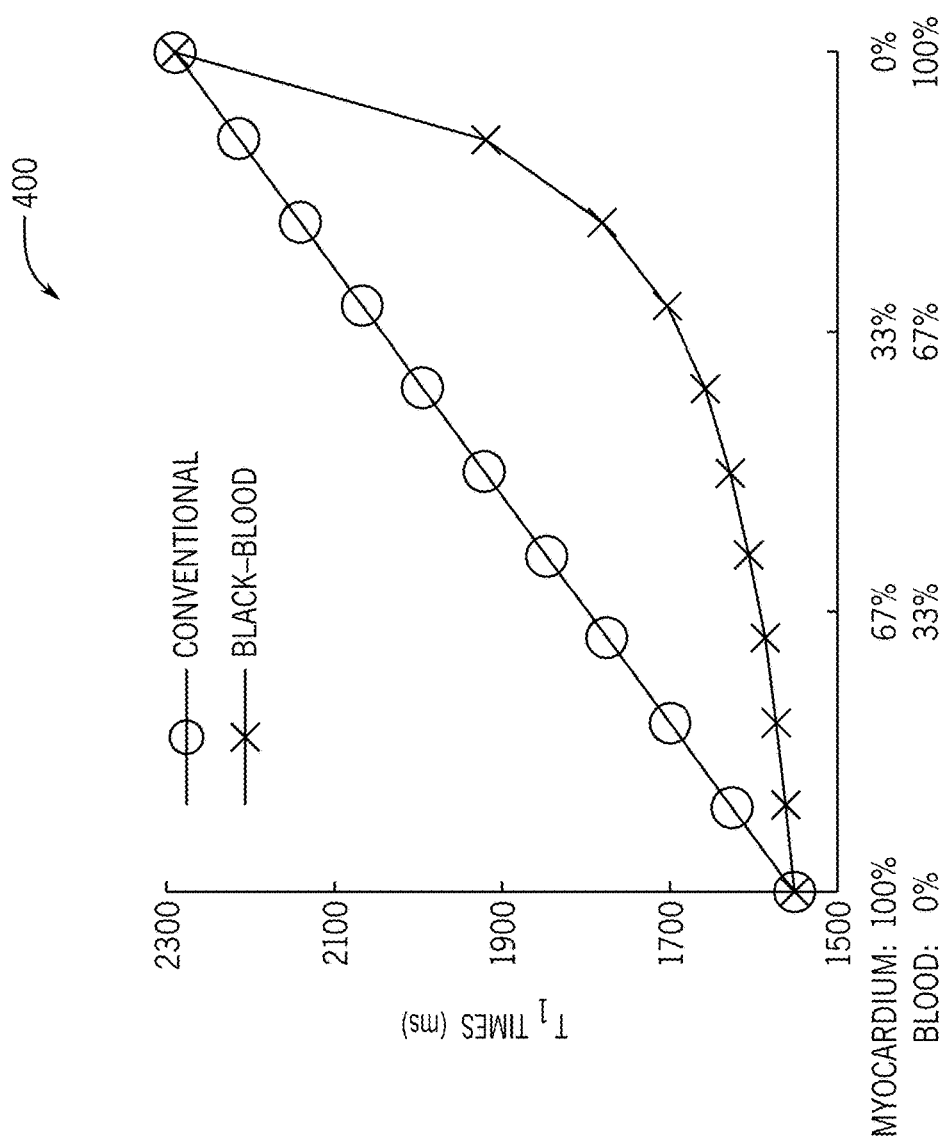
FIG. 4 shows simulated $T_1$ time in a voxel with partial-voluming at varying signal contributions of blood and myocardium using conventional and black-blood Saturation Pulse Prepared Heart-rate independent Inversion REcovery (SAPPHIRE).

FIG. 4 shows Simulated $T_1$ time in a voxel with partial-voluming at varying signal contributions of blood and myocardium using conventional and black-blood SAPPHIRE. A linear increase of the $T_1$ time is observable with more blood contribution, when using conventional SAPPHIRE. The blood-myocardial transition is substantially steepened using the disclosed black-blood technique. Thus, the black-blood approach successfully reduces the impact of blood-signal in the voxel, leading to substantially steeper myocardial-blood transitions.

For example, numerical simulations of a bi-compartment model may be performed to study the effect of partial-voluming on the $T_1$ estimation in a SAPPHIRE sequence. A myocardial-tissue compartment may be simulated with $T_1/T_2=1580$ ms/50 ms and a blood-compartment with $T_1/T_2=2300$ ms/250 ms. Relative signal-to-noise ratio (SNR) of the components with or without MSDE preparation pulse, may be simulated as follows: Without MSDE: Myocardium/Blood=117/119; With MSDE: Myocardium/Blood=95/11. The relative compartmental share between the blood and myocardium may be varied between 0% and 100%. The overall signal of the SAPPHIRE sequence with and without MSDE preparation may be simulated using the Bloch-equations. A three-parameter fit to the simulated signal may yield the $T_1$ time.

To study the visual effects of partial-voluming, a numerical representation of a cardiac short-axis slice was simulated with blood and myocardial compartments of the left and right ventricle. The numerical phantom was generated with a matrix size of 1024×1024 pixels and subsequently down-sampled to matrix-sizes corresponding to approximate pixel resolutions of 1.0×1.0–3.0×3.0 mm² in order to induce partial-voluming. To facilitate comparability between different resolutions, all images were then up-sampled to a reconstruction resolution of 0.75×0.75 mm² prior to further processing. Bloch-equations were used to simulate voxel-wise signals of the numerical phantom, using the same myocardium and blood compartments as described above. Subsequent fitting with a three-parameter model may be used to generate the T1 maps. The three-parameter model avoids quantification inaccuracies caused by MSDE signal reduction.

In this disclosure, the imaging sequence may be performed on a 3T scanner (Magnetom Skyra; Siemens Healthcare, Erlangen, Germany) with a 30 channel receive array. The $T_1$ mapping sequences may be performed with the following imaging parameters: TR/TE=2.9/1.0 ms, flip-angle=45°, bandwidth=1085 Hz/Px, FOV=400×300 mm², in-plane resolution=2.1×2.1 mm², partial-fourier=6/8, GRAPPA-factor 2, number of phase-encoding steps=56. The flip-angle may be adjusted when specific absorption rate (SAR) limitations are reached.

Figure 5A:
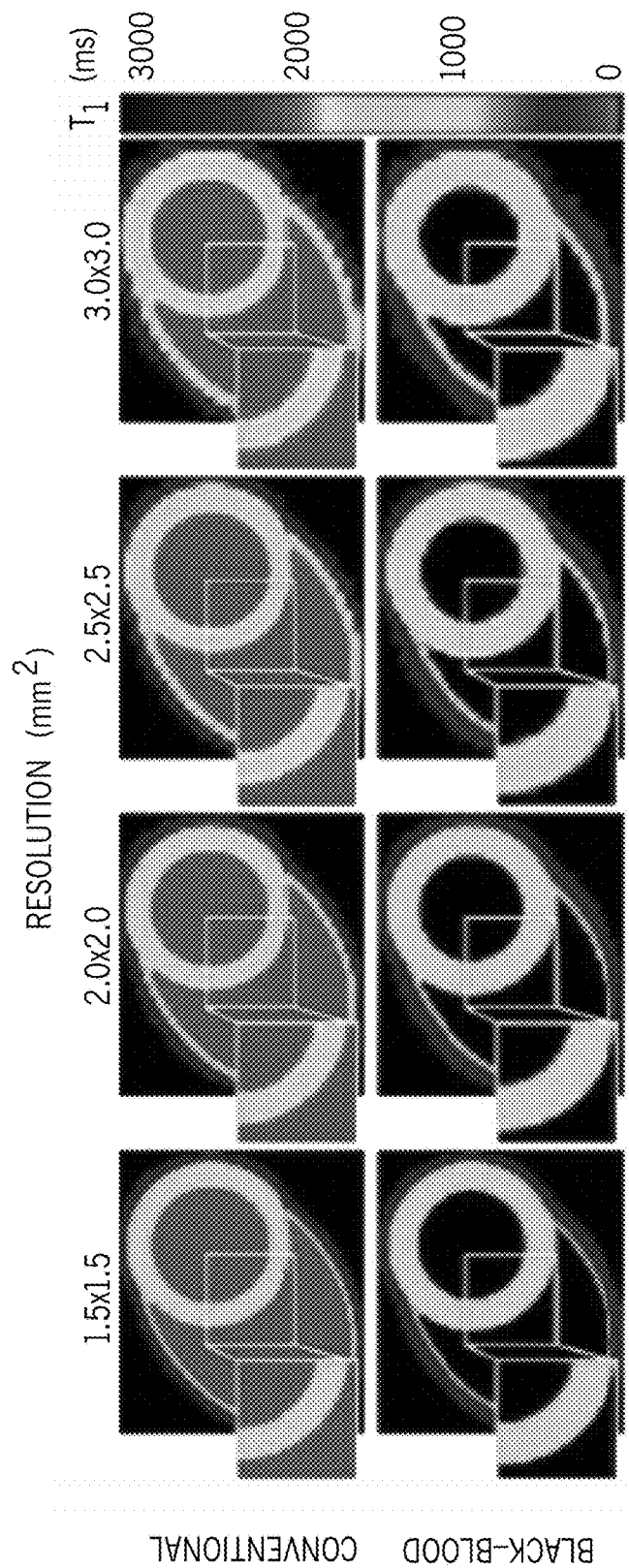
FIG. 5A shows $T_1$ maps generated from numerical phantoms at various resolutions using conventional and black-blood modified SAPPHIRE techniques.

FIG. 5A shows $T_1$ maps generated from numerical phantoms at various resolutions using conventional and black-blood SAPPHIRE. In FIG. 5A, $T_1$ maps are generated from numerical phantoms at various resolutions to obtain a varying degree of partial-voluming. In the upper row of FIG. 5A, decreased myocardial thickness are observed with conventional $T_1$ mapping at coarser resolutions. Using conventional SAPPHIRE, apparent myocardial thickness reduces with coarser sampling resolution, creating smoothed edges at the blood-myocardial interface. In the bottom row of FIG. 5A, the black-blood SAPPHIRE sequence generates $T_1$ mapping which mitigates this effect of partial-voluming.

Figure 5B:
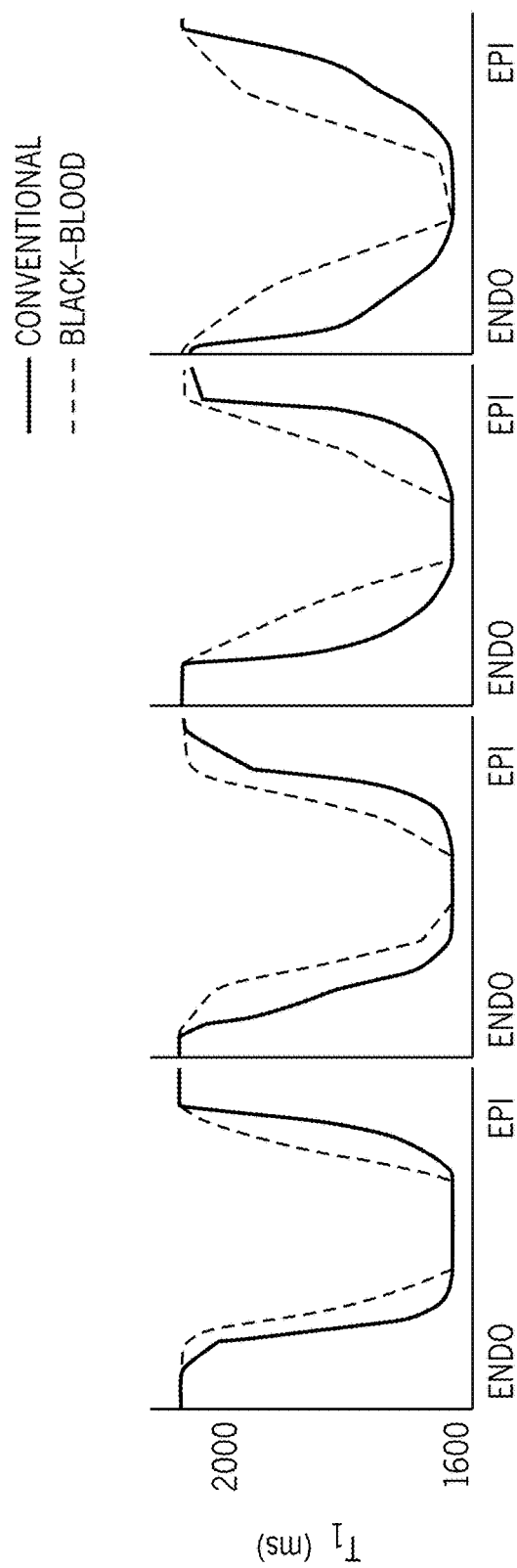
FIG. 5B shows line plots through the myocardium using conventional and black-blood SAPPHIRE.

FIG. 5B shows line plots through the myocardium using conventional and black-blood SAPPHIRE. The line plots show increasingly blurred blood-myocardium interfaces with conventional SAPPHIRE. Steep transitions are maintained using black-blood SAPPHIRE. Coarse sampling leads to flat slopes towards the blood-pool and a reduced width of the plateau with uncorrupted myocardial $T_1$ times. The black-blood preparation, on the other hand maintains steep slopes and a broad area with largely uncorrupted $T_1$ times as apparent in the line plots. This leads to increased myocardial thickness in the numerical phantom.

Figure 6A:
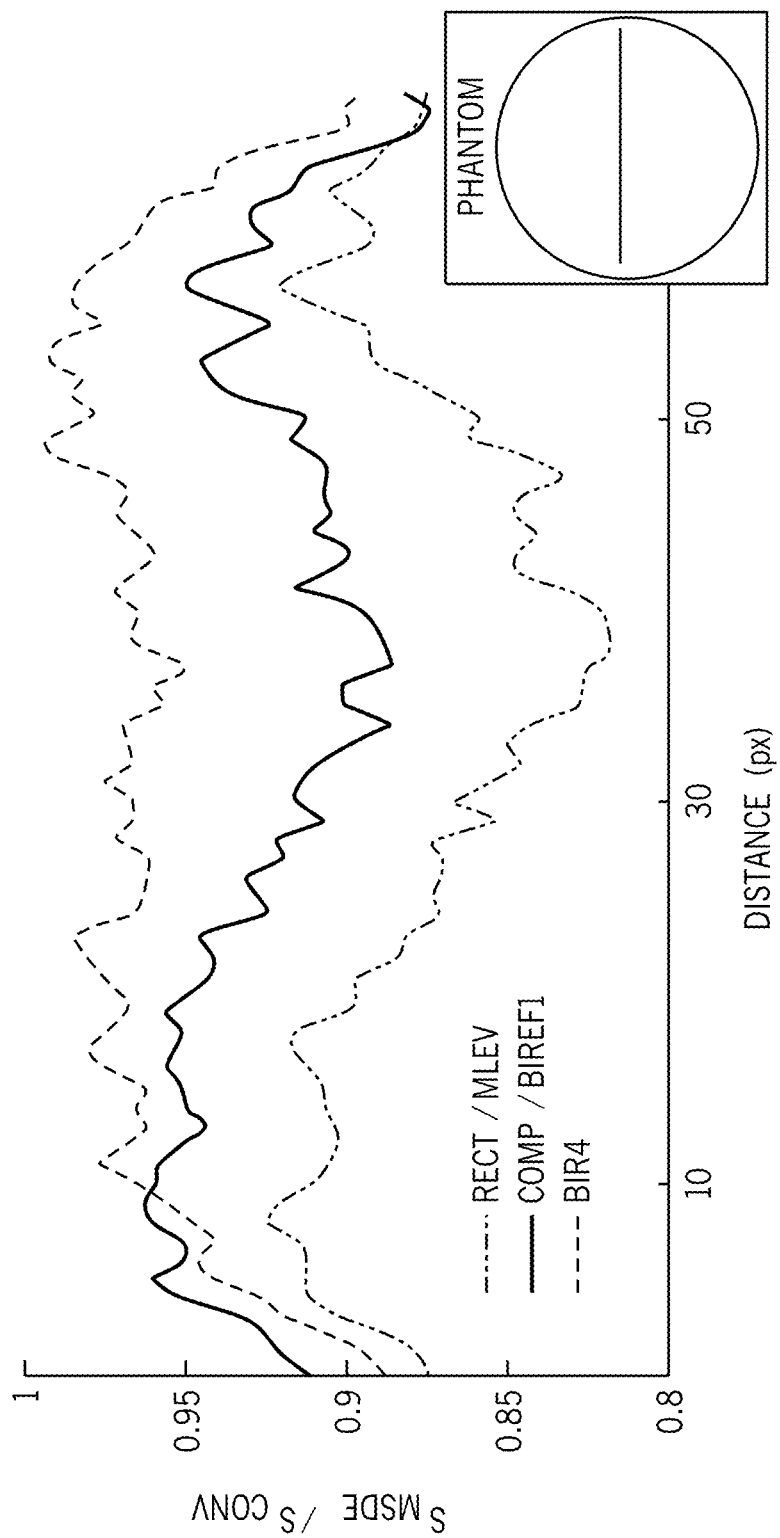
FIG. 6A shows $B_1^+$ uniformity of three MSDE preparation modules in accordance with the present disclosure.
Figure 6B:
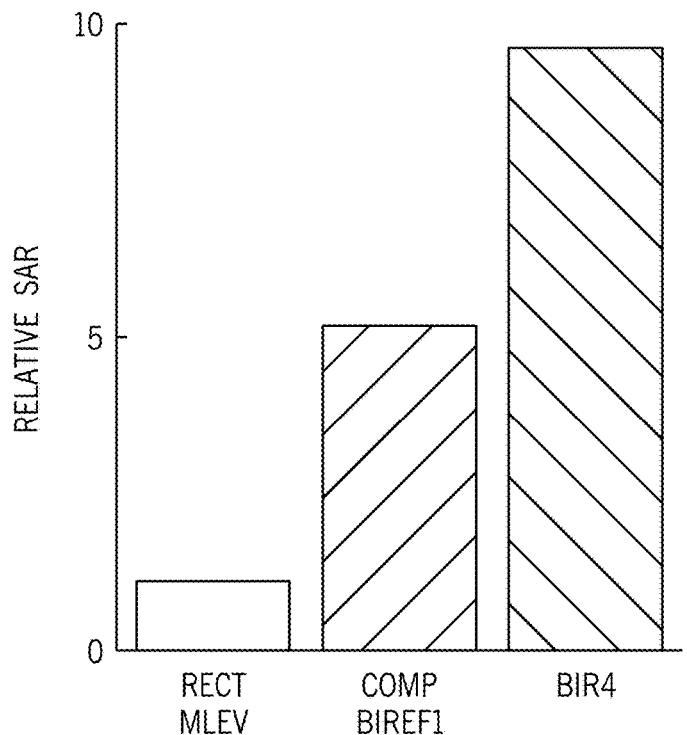
FIG. 6B shows bar-plots of the relative SAR burden of the three MSDE modules.

FIG. 6A shows $B_1^+$ uniformity of three MSDE preparation modules in accordance with the present disclosure. FIG. 6B shows bar-plots of the relative SAR burden of the three MSDE modules. The BIR4 module shows the most uniform signal with the least signal-loss for the cost of highest SAR values. The hybrid Composite/B1-Insensitive Refocusing-1 (COMP/BIREF1) scheme shows a slight signal drop towards the center of the phantom. This trend is strongly increased using a fully rectangular preparation. Here, the BIR4 module may include four segments. In one example, the BIR4 module may be made up of four tan h/tan segments and it is also a non-selective adiabatic pulse. One of the features of a BIR4 pulse is that the flip angle can be set to values other than 90 or 180 degrees (at RF amplitudes above the adiabatic threshold). The flip angle is determined not by the RF amplitude, but by a phase jump between segments 2 and 3 and segments 1 and 4.

For example, imaging may be performed in a static phantom to study $B_1^+$ uniformity of various MSDE preparation modules and to verify the accuracy of the black-blood SAPPHIRE sequence. The following three MSDE preparation modules with different combinations of RF pulses were tested for $B_1^+$ uniformity in a homogeneous phantom containing NaCl-doped water:

1) Rectangular 90° hard-pulses for tip-down and tip-up and a single 180° MLEV refocusing pulse.

2) A rectangular 90° hard-pulse for tip-down, an adiabatic 180° BIREF1 refocusing pulse and a composite (360°-270°) tip-up pulse.

3) A 0° degree three compartment BIR4 pulse, with the MSDE gradients inserted symmetrically between the compartments.

As shown in FIG. 6A, the BIR4 adiabatic module results in the least signal loss with the most homogeneous signal profile. As noted above, the hybrid Composite/BIREF1 module shows slightly increased signal loss with a signal drop towards the center of the phantom. This trend is strongly increased using the rectangular module. However, the relative SAR of the BIR4, Composite/BIREF1 and the rectangular module were 9.6, 5.2 and 1.0, respectively. The Composite/BIREF1 module was used for blood suppression as a trade-off in the remainder of the study.

The echo-time of the three MSDE modules may be fixed to $TE_{MSDE}=15$ ms. $B_1^+$ uniformity was assessed as the signal of a MSDE prepared single-shot image normalized by the signal of a single-shot image without MSDE preparation. The MRI may use other imaging parameters as described above.

Furthermore, accuracy of the SAPPHIRE black-blood sequence was evaluated in phantom scans. The phantom was composed of seven vials containing agarose-gel doped with various concentrations of gadoterate meglumine (Dotarem; Guerbet, Aulnay-sous-Bois, France) to achieve $T_1$ and $T_2$ times in the physiological range. The combination of composite-pulses and the adiabatic refocusing was used for MSDE preparation in the remainder of the study. Conventional SAPPHIRE without MSDE preparation was performed as a reference.

Figure 7:
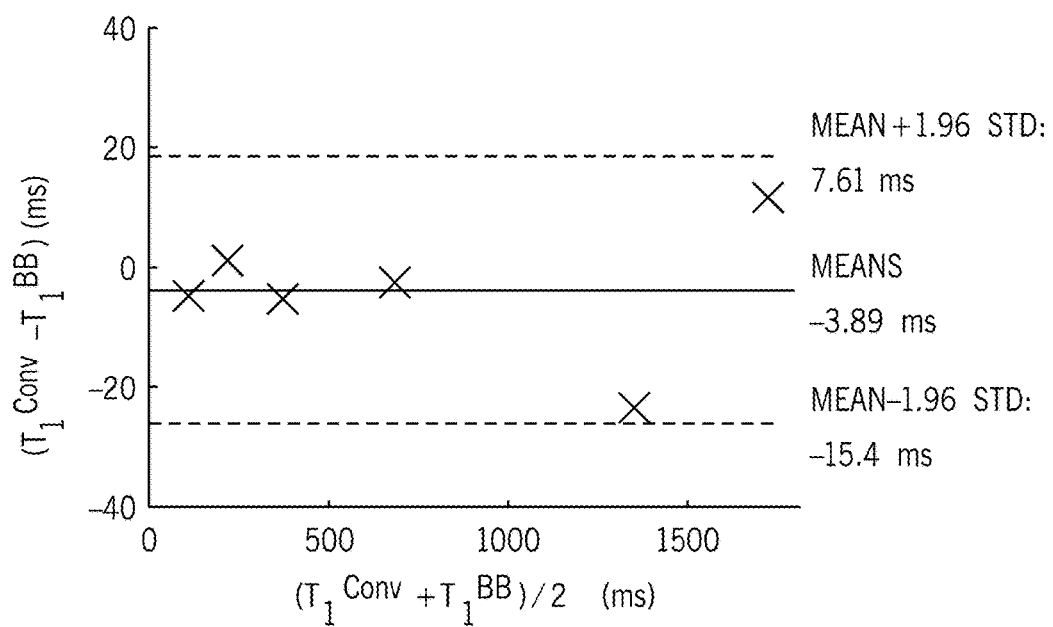
FIG. 7 shows Bland-Altman analysis of phantom $T_1$ times assessed with conventional and black-blood SAPPHIRE.

FIG. 7 shows Bland-Altman analysis of phantom $T_1$ times assessed with conventional and black-blood SAPPHIRE. Here, the $T_1$ times obtained with the SAPPHIRE black-blood sequence are compared to conventional SAPPHIRE using Bland-Altman analysis. A good agreement with minimal average deviation is shown between the two sequences. The average deviation was −3.9±11.5 ms for phantom vials with T1 times between 100 and 1800 ms.

In an in-vivo experiment, the black-blood preparation was optimized in a cohort of five healthy subjects (3 male, 29±4 years old). Baseline images without saturation/inversion preparation, as acquired in the SAPPHIRE black-blood sequence, were obtained with varying the echo time $TE_{MSDE}$ from 10 ms to 15 ms. The effectiveness of blood-suppression was quantitatively analyzed as the contrast-tonoise ratio (CNR) between the left-ventricular myocardium and the left-ventricular blood-pool. To capture the effects of stagnant blood in the CNR, manually drawn endocardial contours, covering the entire LV blood-pool were used for signal analysis of the blood. Signal heterogeneity in the myocardium, caused by the MSDE preparation, was quantitatively analyzed as the coefficient of variance (COV) of the signal over the entire myocardium between the epiand the endocardial contours.

Figure 8:
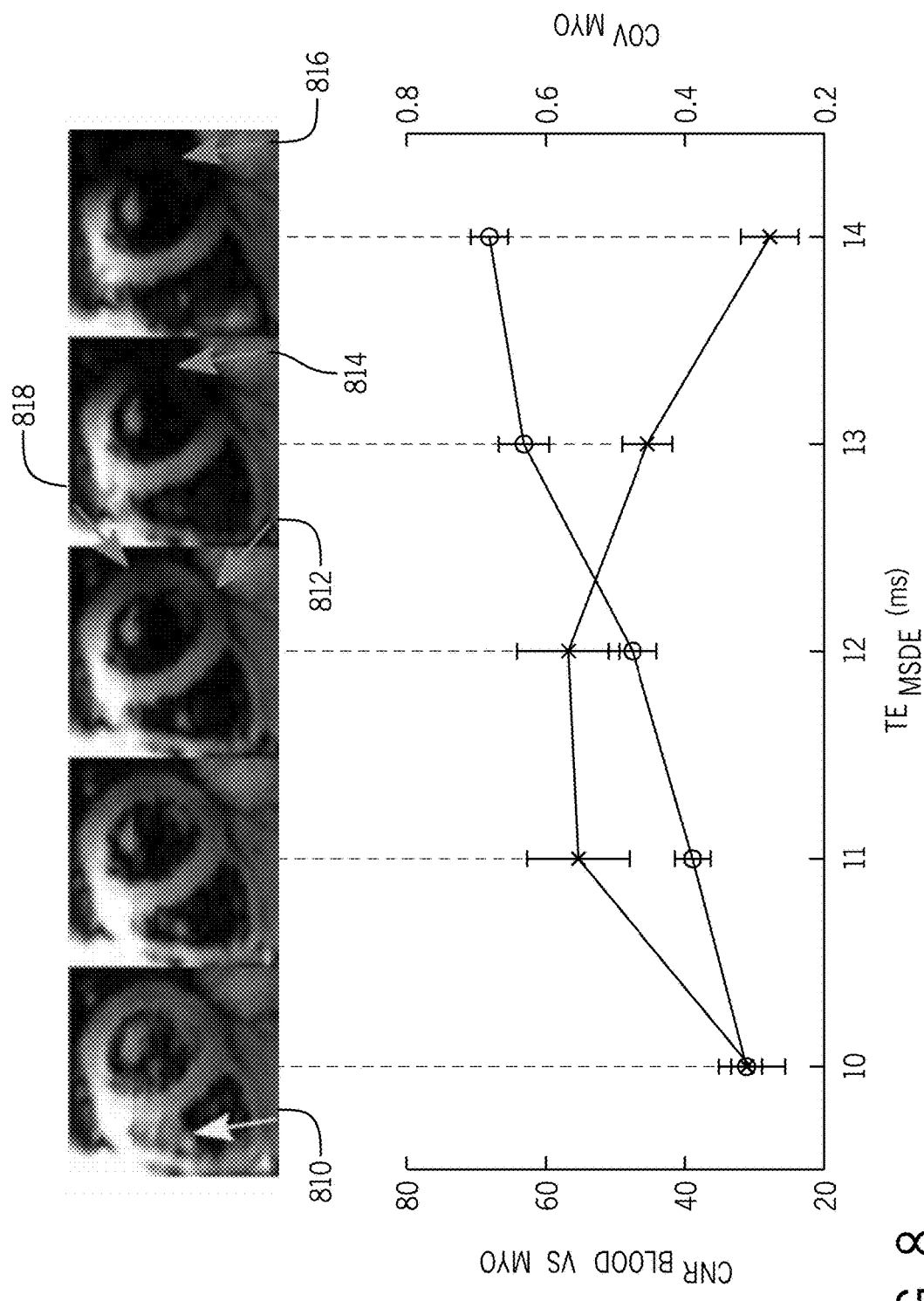
FIG. 8 illustrates Black-blood contrast as a function of the MSDE preparation echo time.

FIG. 8 illustrates Black-blood contrast as a function of the MSDE preparation echo time. In the upper row of FIG. 8, exemplary baseline images show residual blood-signal for too short echo-times (yellow arrow 810), while long echo-times cause myocardial signal void (orange arrows 812, 814, 816 and 818). Accordingly, the contrast-to-noise ratio (CNR) between myocardium and blood-pool is compromised for long and very short echo-times. The coefficient of variance (COV) in the myocardium increases with longer echo-times, caused by progressive signal void.

In FIG. 8, the analysis of MSDE-prepared single-shot images are acquired with various echo times ($TE_{MSDE}$). Residual blood signal is readily visible in the exemplary images if the echo-time is chosen too short (10 ms) causing decreased CNR. However, progressively strong signal void in the lateral area of the myocardium can be observed with increasing echo-times, due to increased motion during the preparation. This reflects as increased signal heterogeneity in the myocardium (COV), and causes a CNR drop for long echo times. $TE_{MSDE}=11$ ms shows substantially higher blood-myocardium contrast than shorter echo times and reduced signal heterogeneity compared to long $TE_{MSDE}$. Thus, the MRI system may set the echo-time value to be 11 ms so that the images may offer a good trade-off between blood suppression and signal void.

In another in-vivo experiment, a separate cohort of eight healthy volunteers (4 male, 28±4 years old) was recruited for $T_1$ time analysis. Imaging was performed using standard and black-blood SAPPHIRE in three short-axis slices and one four-chamber slice. $T_1$ times were evaluated using manually drawn ROIs. Average segmental $T_1$ times were assessed according to the AHA 16-segment model. Precision was obtained as the average inter-segment variation. The average myocardial thickness was assessed between the manually drawn epi- and endocardial contours: 1000 spokes through the center of mass were uniformly spread around the myocardium. Thickness was then defined as the average distance of the crossing point of the spoke with the endo- and epicardial border, respectively. $T_1$ times, $T_1$ time precision and average myocardial ROI thickness were compared between conventional and black-blood SAPPHIRE on a per subject basis using student's t-test. P-values<0.05 were considered to be significant.

Partial-voluming effects in the myocardium were visualized by analyzing the transmural $T_1$ times in five rings around the myocardium from the endo- to the epi-cardial border. The rings were divided in three segments around the myocardium (septal, antero- and inferolateral). Average $T_1$ time per segment and per ring was then compared between conventional and black-blood SAPPHIRE.

Figure 9A:
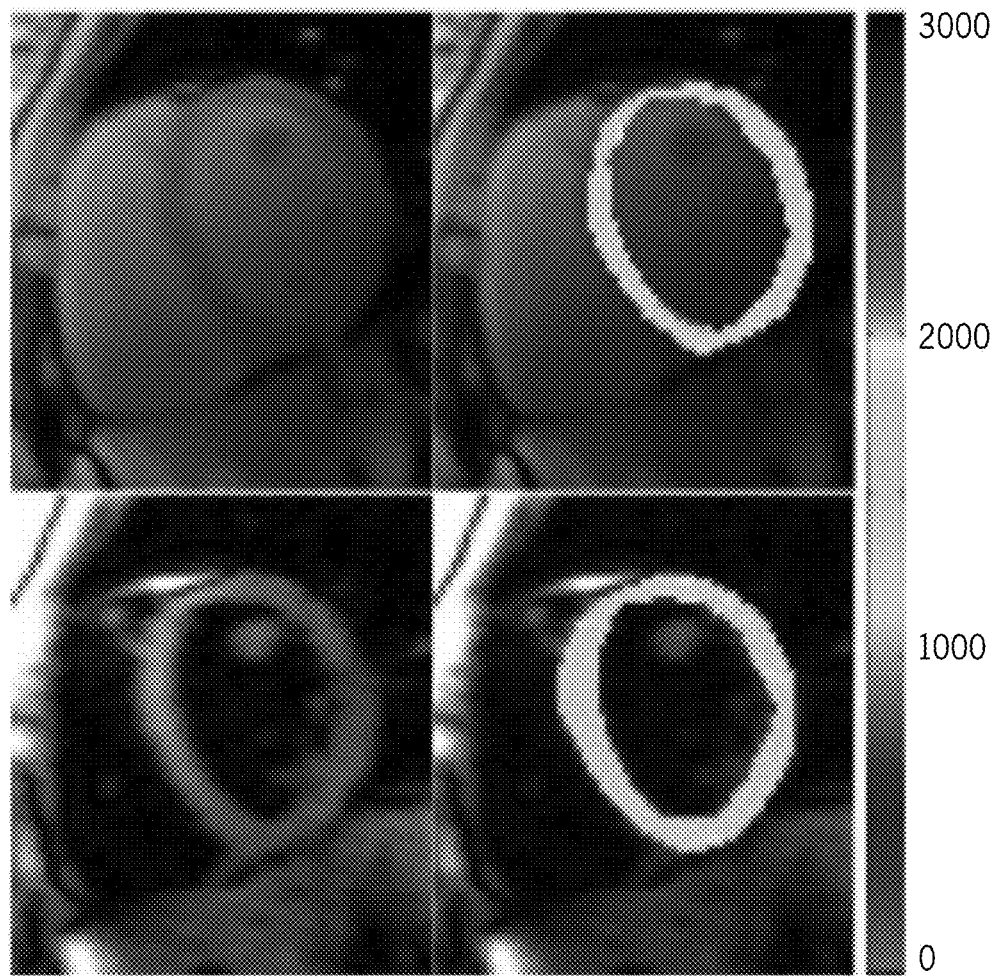
FIG. 9A shows $T_1$ weighted baseline images and color-scaled myocardial T1 map overlays for a first healthy subject.
Figure 9B:
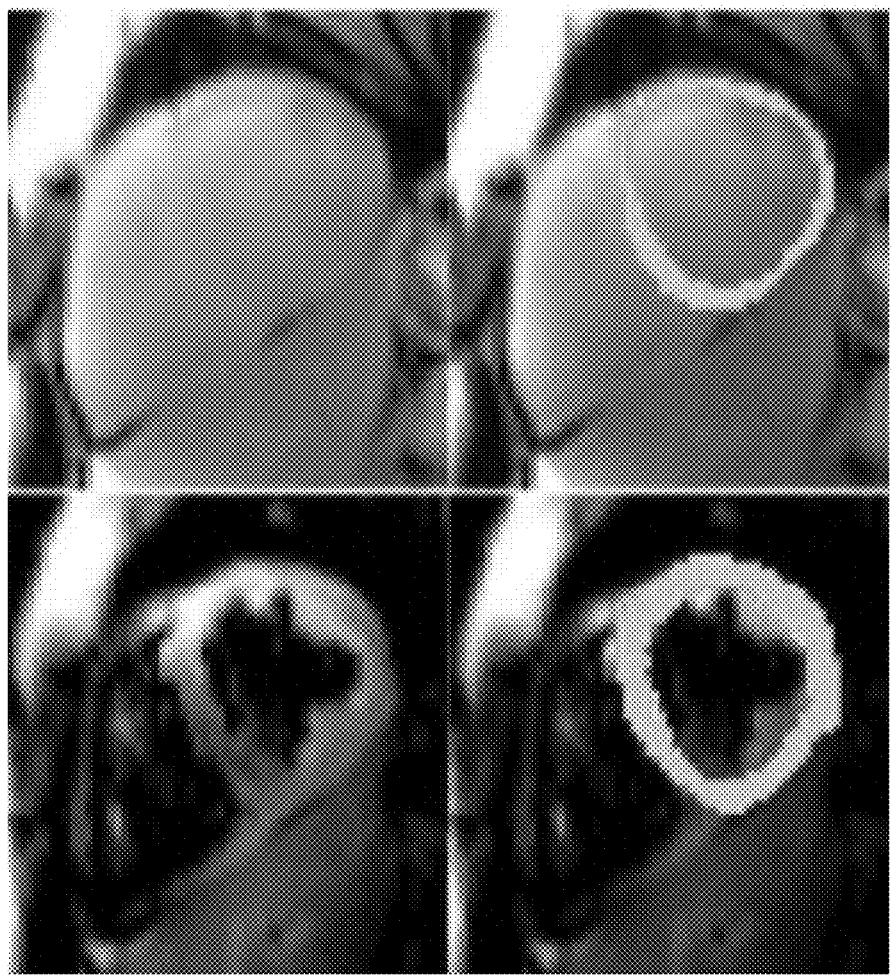
FIG. 9B shows $T_1$ weighted baseline images and color-scaled myocardial T1 map overlays for a second healthy subject.
Figure 9C:
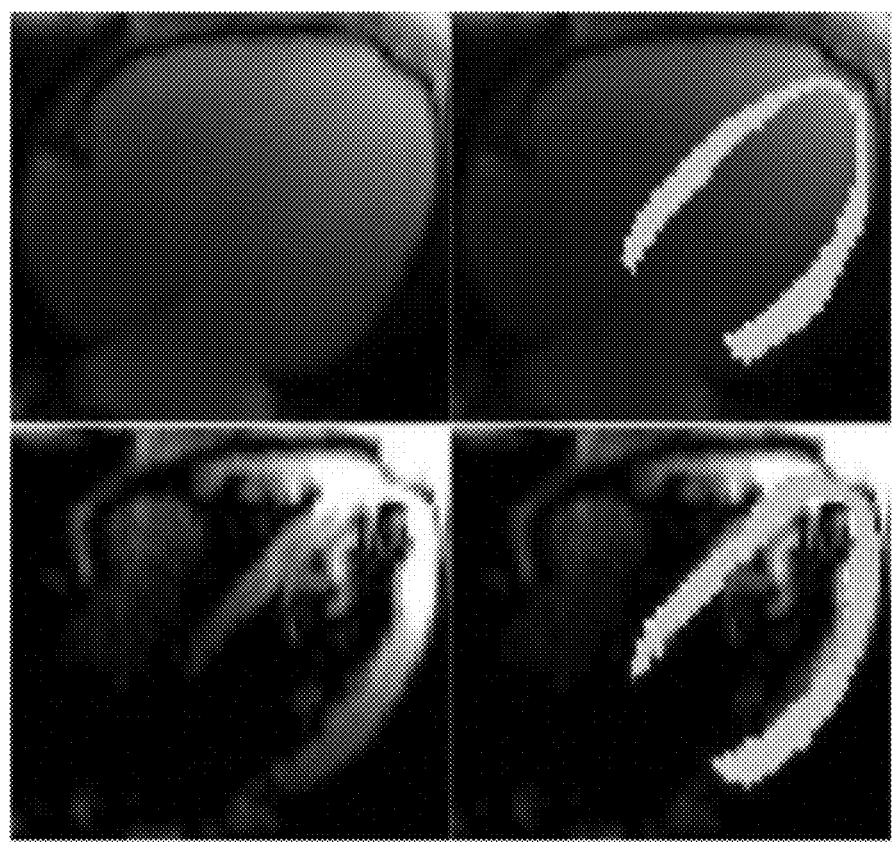
FIG. 9C shows $T_1$ weighted baseline images and color-scaled myocardial $T_1$ map overlays for a third healthy subject.

FIG. 9A shows $T_1$ weighted baseline images and color-scaled myocardial $T_1$ map overlays for a first healthy subject. $T_1$ weighted baseline images are shown in the left column and color-scaled myocardial $T_1$ map overlays are shown in the right column. The images are acquired in short-axis or four-chamber orientation. FIG. 9B shows $T_1$ weighted baseline images in the left column and color-scaled myocardial $T_1$ map overlays in the right column for a second healthy subject. FIG. 9C shows $T_1$ weighted baseline images in the left column and color-scaled myocardial $T_1$ map overlays in the right column for a third healthy subject. Good homogeneity of the $T_1$ times is assessed with both techniques in all subjects shown in FIGS. 9a-9c. Slightly increased variability is visible in the black-blood approach.

Here, the imaging flip-angle may be reduced by 2° in one healthy subject due to SAR limitations. Representative $T_1$ maps acquired with conventional and black-blood SAPPHIRE are shown as myocardial-overlays together with the corresponding $T_1$ weighted baseline images in FIG. 9A-9C. Good $T_1$ time homogeneity throughout the myocardium is observed with both techniques. Black-blood SAPPHIRE shows slightly increased variability by visual inspection. However, visually increased myocardial thickness is achieved with the black-blood sequence.

Figure 10:
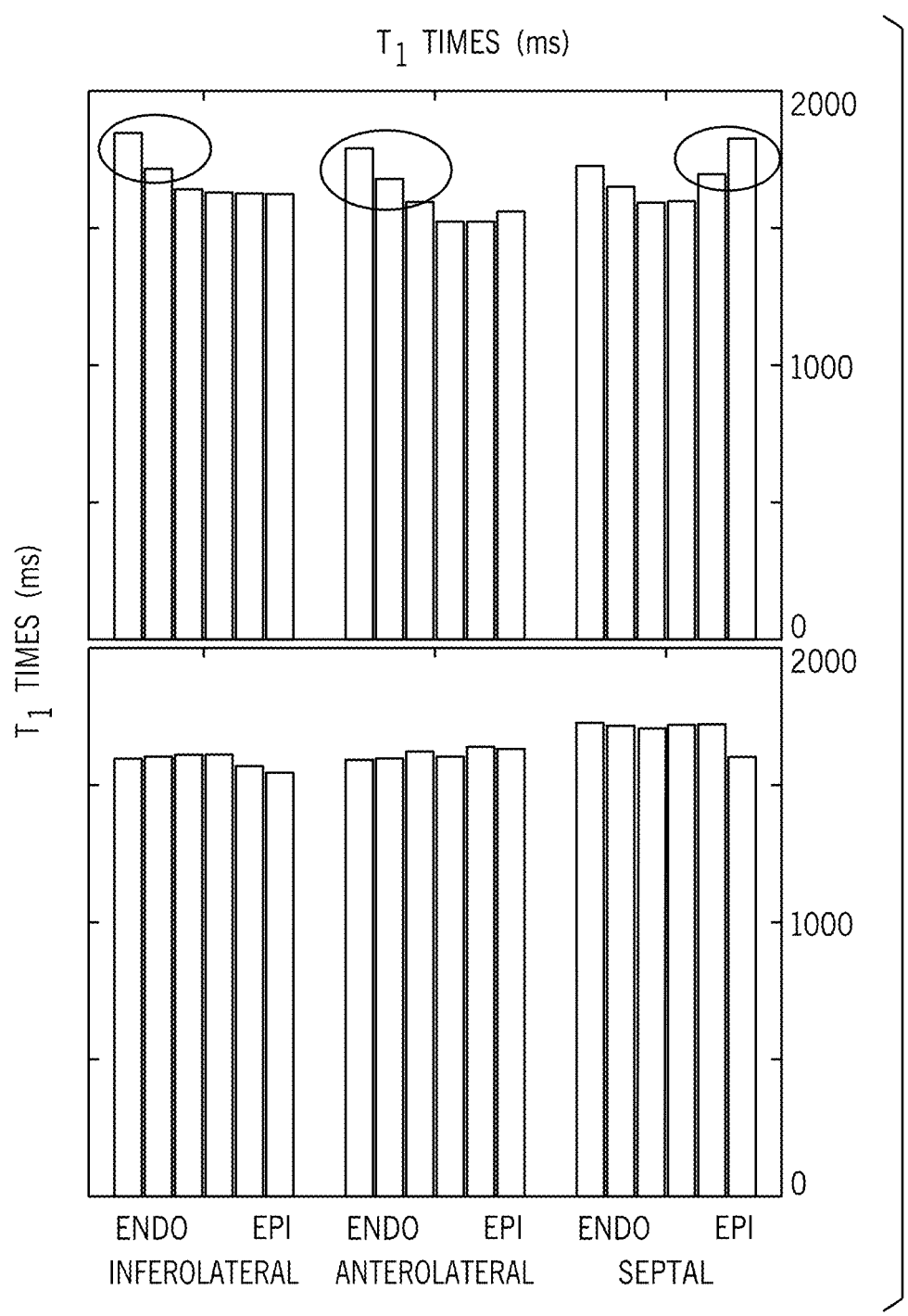
FIG. 10 shows the analysis of the transmural $T_1$ times in the first subject.

FIG. 10 shows the analysis of the transmural $T_1$ times in the first subject. Conventional $T_1$ mapping shows increased $T_1$ times at the blood-myocardial interface. However, no such elevation is observed with the black-blood technique. Here, partial-voluming effects in the myocardium were visualized by analyzing the transmural $T_1$ times in five rings around the myocardium from the endo- to the epi-cardial border. The rings were divided in three segments around the myocardium (septal, antero- and inferolateral). Average $T_1$ time per segment and per ring was then compared between conventional and black-blood SAPPHIRE.

Figure 13A:
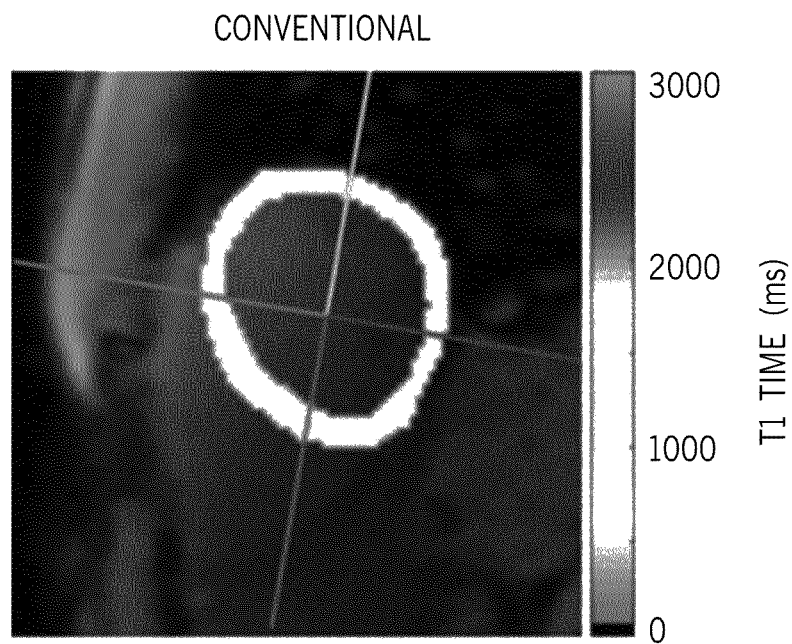
FIG. 13A shows $T_1$-times through the myocardium using conventional sequence.
Figure 13B:
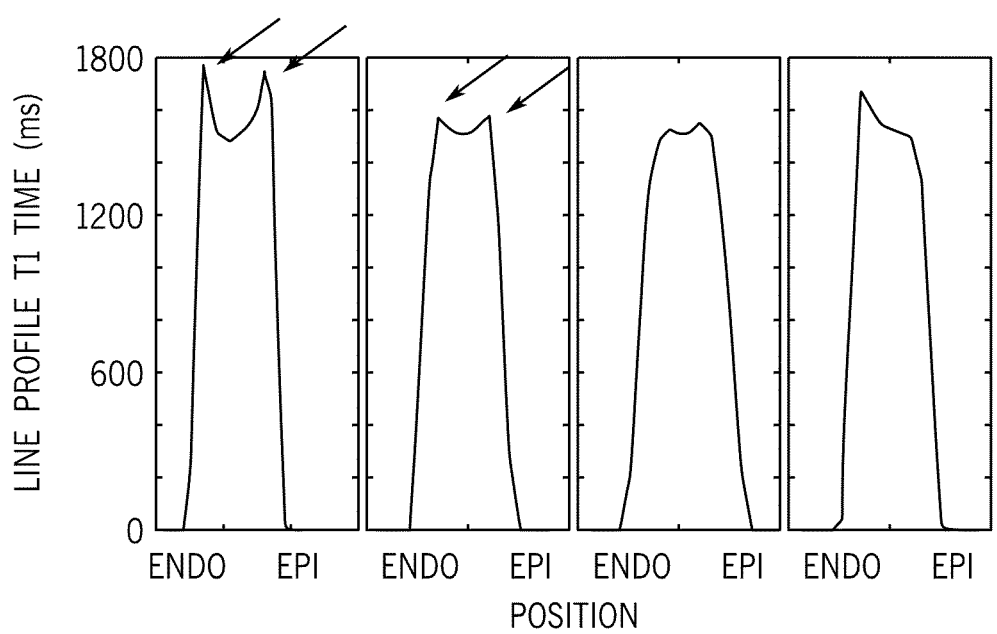
FIG. 13B shows line profile of the $T_1$-times through the myocardium using conventional sequence.
Figure 13C:
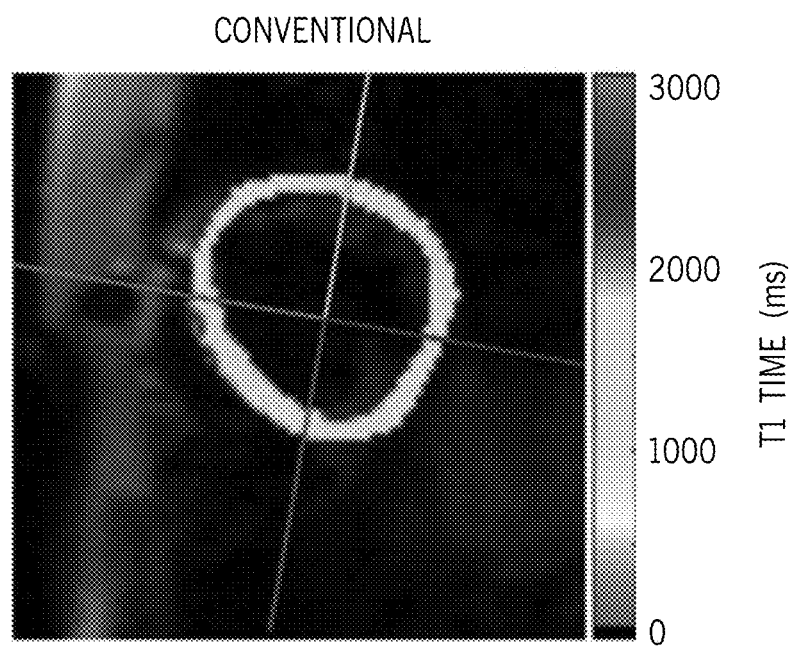
FIG. 13C shows $T_1$-times through the myocardium using black-blood $T_1$-mapping.
Figure 13D:
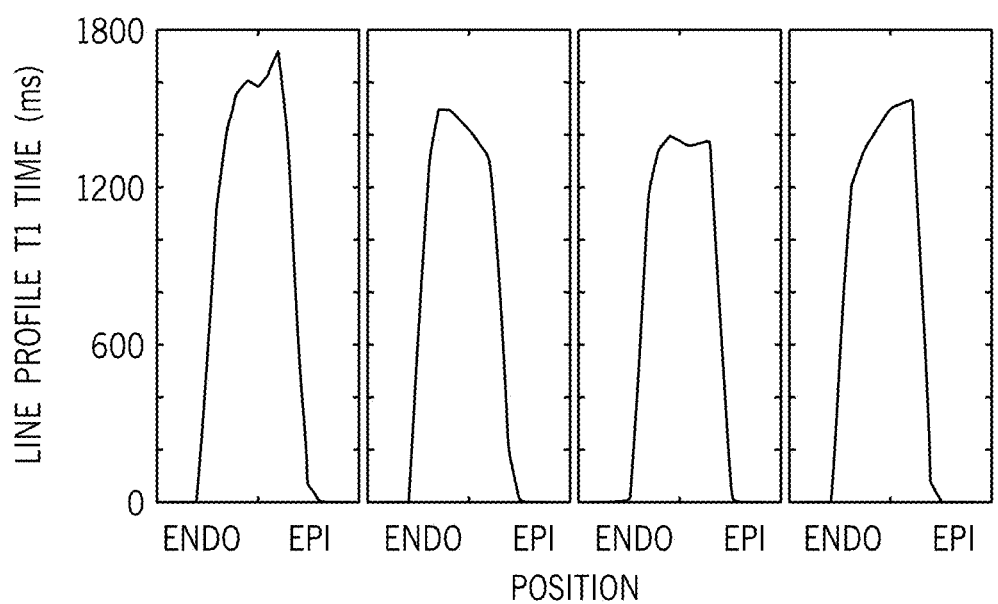
FIG. 13D shows line profile of the $T_1$-times through the myocardium using black-blood $T_1$-mapping.

FIG. 13A shows $T_1$-times through the myocardium using conventional sequence. FIG. 13B shows line profile of the $T_1$-times through the myocardium using conventional sequence. FIG. 13D shows $T_1$-times through the myocardium using black-blood T1-mapping. FIG. 13D shows line profile of the $T_1$-times through the myocardium using black-blood T1-mapping.

Here, $T_1$-time profiles were obtained along the lines indicated in the $T_1$ maps. As highlighted with the arrows in FIG. 13B, major partial voluming leads to $T_1$ overestimation at myocardial borders. No such partial-voluming spikes are observed with black-blood $T_1$-mapping in FIG. 13D.

Here, no significant difference is found between the average $T_1$ times of the conventional and the black-blood approach (1583±58 ms vs. 1562±56 ms, p=0.20), with slightly lower $T_1$ time in the black-blood sequence, especially in the septal regions. However, precision, as assessed by intra-segmental $T_1$ variation, is significantly increased using the black-blood approach (63.1±6.4 ms vs. 133.9±24.6 ms; p<0.0001). The myocardial thickness in SAPPHIRE black-blood T1 times was significantly increased by an average of 50±22% compared to conventional

TABLE 1

Average myocardial ROI thickness of conventional and black-blood T1 mapping.
Average myocardial ROI thickness (mm)

| SHAX Slice | Conventional | Black-Blood | Difference* |
|---|---|---|---|
| Apical | 4.1 ± 0.7 | 6.2 ± 1.5 | 52% ± 24% |
| Mid | 4.7 ± 1.1 | 7.3 ± 1.5 | 61% ± 33% |
| Basal | 5.1 ± 0.8 | 6.8 ± 1.0 | 36% ± 22% |
| Average | 4.6 ± 0.7 | 6.8 ± 0.8 | 50% ± 22% |

*p < 0.05 for all differences

Figure 11B:
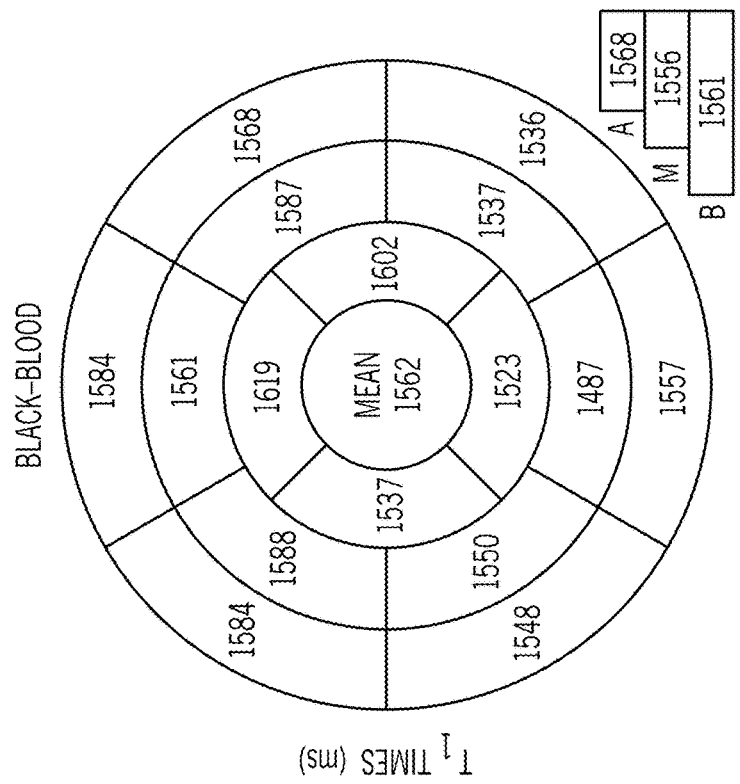
FIG. 11B illustrates a Bulls-eye representation of $T_1$ times in the 16 AHA segments across three slices (A=apical, M=midventricular, B=basal) acquired with Black-blood SAPPHIRE sequence.
Figure 11A:
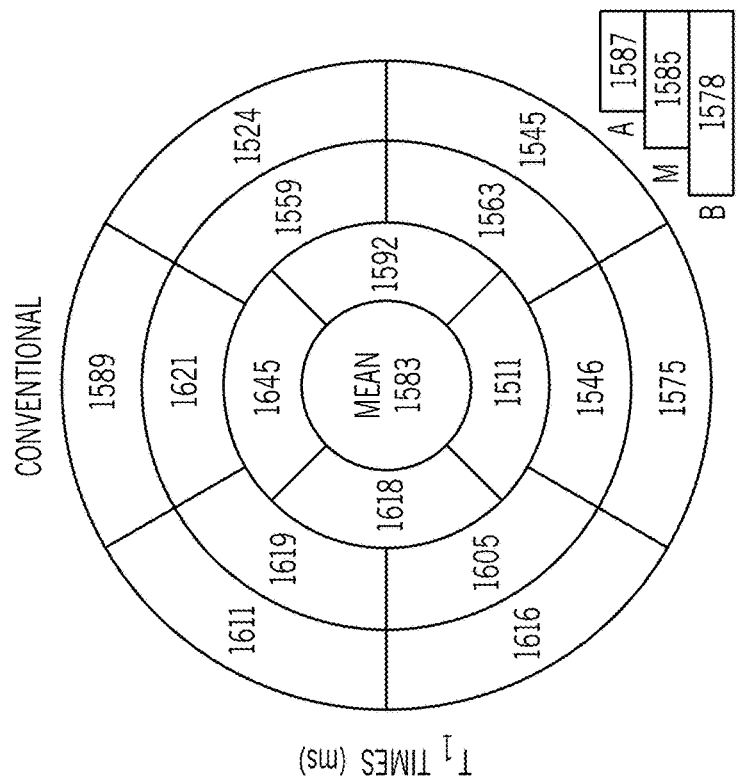
FIG. 11A illustrates a bulls-eye representation of $T_1$ times in the 16 AHA segments across three slices (A=apical, M=midventricular, B=basal) acquired with conventional sequence.
Figure 11D:
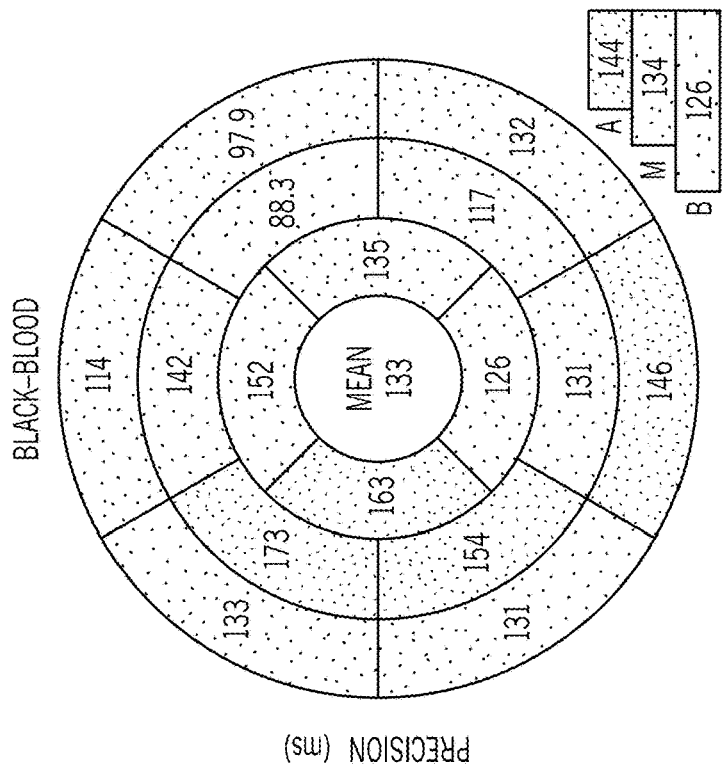
FIG. 11D illustrate a Bulls-eye representation of precision in the 16 AHA segments across three slices (A=apical, M=midventricular, B=basal) acquired with Black-blood SAPPHIRE sequence.
Figure 11C:
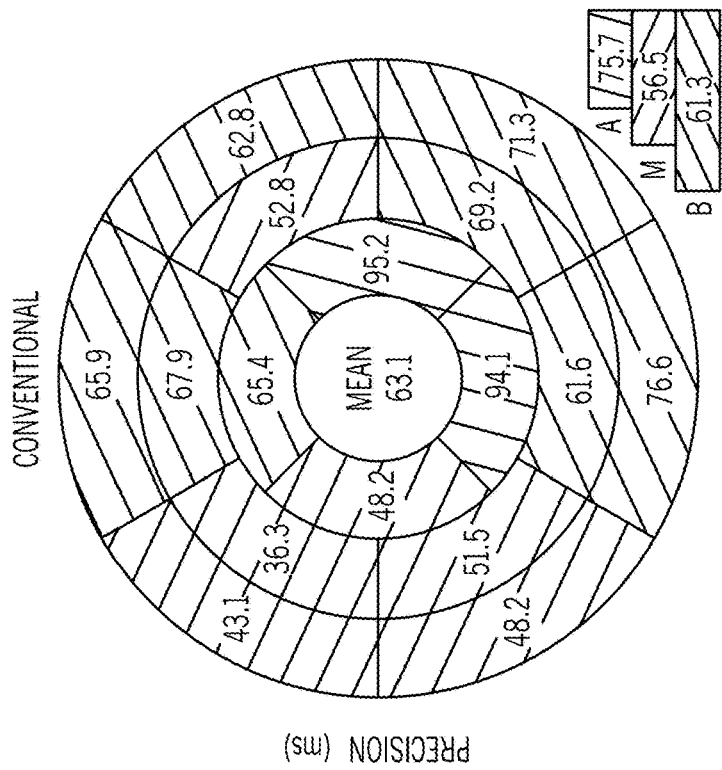
FIG. 11C illustrates a bulls-eye representation of precision in the 16 AHA segments across three slices (A=apical, M=midventricular, B=basal) acquired with conventional sequence.

FIG. 11A illustrate a bulls-eye representation of $T_1$ times in the 16 AHA segments across three slices (A=apical, M=midventricular, B=basal) acquired with conventional sequence. FIG. 11B illustrate a bulls-eye representation of $T_1$ times in the 16 AHA segments across three slices (A=apical, M=midventricular, B=basal) acquired with black-blood SAPPHIRE sequence. FIG. 11D illustrate a bulls-eye representation of precision in the 16 AHA segments across three slices (A=apical, M=midventricular, B=basal) acquired with conventional sequence. FIG. 11D illustrate a bulls-eye representation of precision in the 16 AHA segments across three slices (A=apical, M=midventricular, B=basal) acquired with black-blood SAPPHIRE sequence.

The average $T_1$ times in the five septal AHA segments, which are in the vicinity of both blood-pools, were compared between conventional and black-blood SAPPHIRE at the various altered ROIs. Correlation between the septal $T_1$ time and the ROI thickness were identified using Pearson's correlation-coefficient. Furthermore, one-way analysis of variance (ANOVA) was employed to test the $T_1$ times at various ROI thicknesses for differences in the mean, to exclude nonlinear trends. P-values <0.05 were considered to be significant.

From FIG. 11A-11D, septal $T_1$ times assessed with conventional SAPPHIRE show a strongly increasing trend for dilated ROIs ($R^2$=0.99) with significantly different $T_1$ times at different ROI sizes (p=0.012). SAPPHIRE black-blood shows good invariance to the ROI thickness over a wide-range with no increasing trend and no significant difference in the ANOVA ($R^2$=0.29, p=0.997).

Figure 12A:
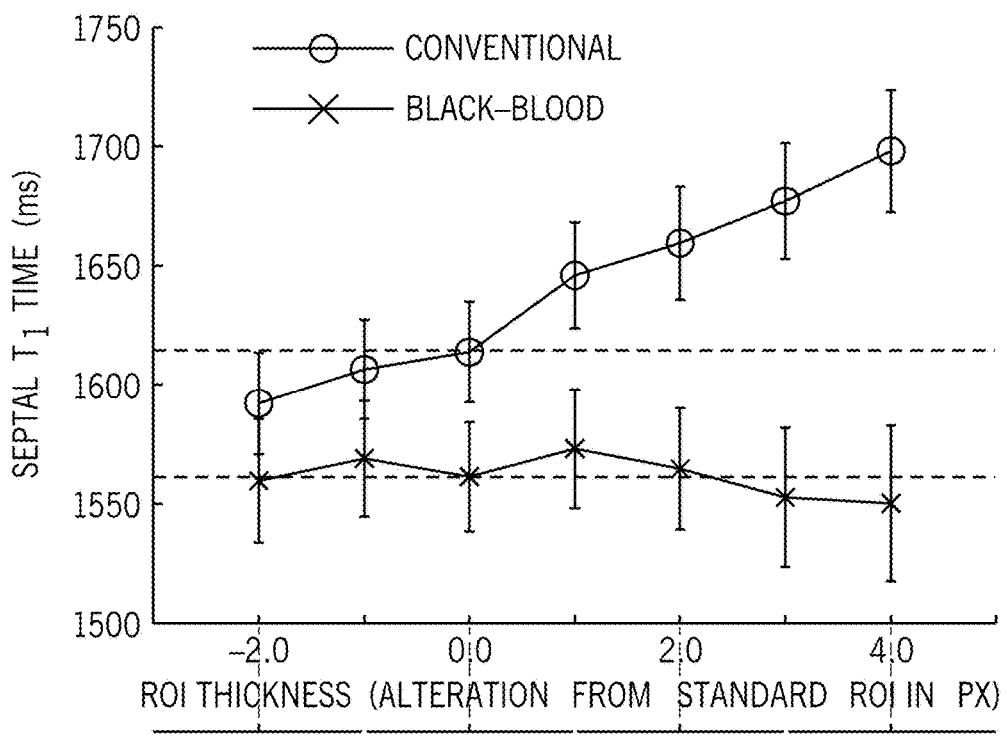
FIG. 12A shows the septal $T_1$ times, at various alterations of the standard, manually drawn ROI, obtained by progressive erosion/dilation.

FIG. 12A shows the septal $T_1$ times, at various alterations of the standard, manually drawn ROI, obtained by progressive erosion/dilation. The binary ROI masks were eroded or dilated by up to two and four pixels, respectively, to decrease/increase the myocardial ROI thickness.

Figure 12B:
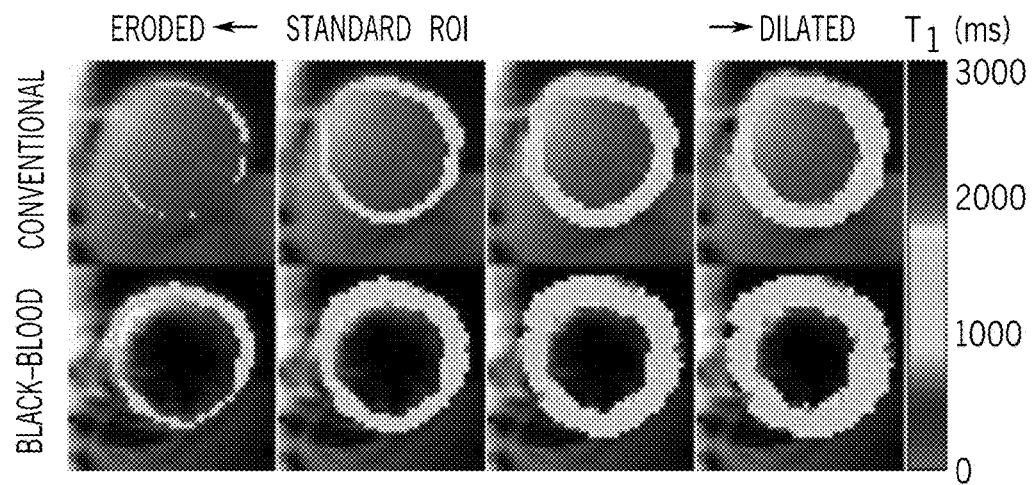
FIG. 12B shows the corresponding ROIs as color-scaled $T_1$ map overlays.

FIG. 12B shows the corresponding ROIs as color-scaled $T_1$ map overlays. In the upper row of FIG. 12B, strongly increased $T_1$ times are observed at increased myocardial ROI thickness in the conventional technique, due to the progressive inclusion of blood in the ROI. However, in the bottom row of FIG. 12B, no such trend is observed using the SAPPHIRE black-blood sequence.

Figure 14:
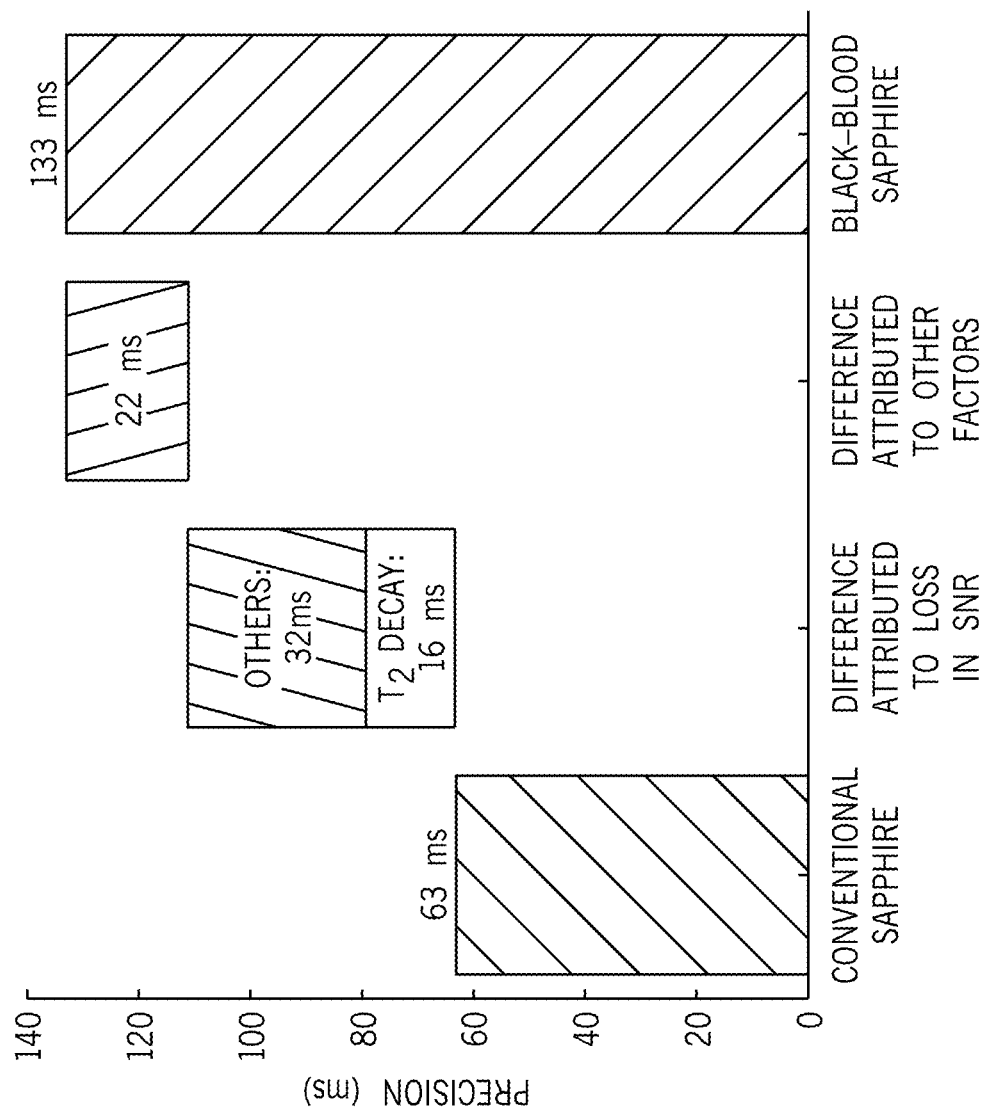
FIG. 14 shows the average contribution of various sources of additional variability to the loss in T1 mapping precision with the disclosed SAPPHIRE black-blood technique.

FIG. 14 shows the average contribution of various sources of additional variability to the loss in T1 mapping precision with the disclosed SAPPHIRE black-blood technique. The baseline SNR of the T1 weighted images used in the black-blood SAPPHIRE sequence are analyzed to gain further insight into the loss of precision with the proposed sequence. The SNR analysis was performed in the two septal segments of the basal slice and revealed a ~40% drop in SNR in the baseline image. Only a ~20% (i.e. 1−exp(−TEMSDE/T2), with TEMSDE=11 ms and T2 50 ms) drop in SNR is expected from the T2 decay. However, additional loss in SNR can be expected due to residual bulk motion of the myocardium and potential pulse imperfections in the MSDE preparation. A further potential source of SNR loss is the diffusion weighting induced in the myocardium. However, given the low b-value of the MSDE preparation (<1 s/mm2), this may be negligible.

Beyond the loss in SNR in the baseline images, additional loss in the precision of the T1 maps can be attributed to two sources: 1) decreased resilience to imaging artifacts (such as fold-over) at lower SNR and 2) additional variation among the baseline images (caused by e.g. differences in the residual myocardial motion). In sum, T2 decay during the MSDE preparation was found to be a minor source of variability, compared to additional SNR loss, and additional variability among the base-line images.

The disclosure provides a MSDE prepared SAPPHIRE sequence for blood-signal suppressed $T_1$ mapping. Numerical simulations showed that black-blood $T_1$ mapping benefits from decreased sensitivity to partial-voluming effects and increased apparent myocardial wall thickness. Phantom $T_1$ times of black-blood SAPPHIRE were in good agreement with the conventional sequence. In-vivo $T_1$ maps in healthy volunteers showed thorough blood suppression with the chosen MSDE module and robust $T_1$ quantification in myocardial ROIs with increased thickness for the trade-off against decreased precision. Black-blood $T_1$ mapping successfully eliminated the $T_1$ time dependence on the ROI thickness, indicating the mitigation of partial-voluming effects and high resilience to ROI alterations.

To account for these differences and to ensure optimal blood suppression that meets the requirements of quantitative imaging, a separate optimization of the MSDE preparation and the motion sensitizing gradient strength was performed. A hybrid adiabatic/composite preparation module was chosen as a trade-off between $B_1^+$ uniformity and SAR that enables thorough blood-suppression in the healthy volunteer cohort, suitable for quantitative imaging. The assessed optimal echo time ($TE_{MSDE}$) leads to a first order gradient moment of $m_1$=168 mT·ms²/m.

Further, to enable optimal blood-suppression with minimal signal-void in the myocardium, careful positioning of the preparation at a time-point with minimal contractile motion of the heart may be necessary. Imaging was performed at late end-diastole in order to accommodate the MSDE preparation well within the end-diastolic quiescence. A fixed echo-time $TE_{MSDE}$=11 ms showed consistent $T_1$ map quality in the healthy cohort. However, in patients with high heart-rates or arrhythmias, cardiac motion during the MSDE preparation might be unavoidable and potentially detrimental to the image quality in the proposed black-blood approach. Patient-specific adaption of the MSDE preparation may need to be performed in these cases to achieve optimal image quality. $TE_{MSDE}$ scouting may be needed to enable efficient selection of the patient specific optimal echo-time.

In this disclosure, rapid imaging during a breath-hold eliminated these error sources and enabled reproducible T1 mapping in the left ventricle. However, depiction of the right ventricle is hindered by the lack of fat-signal suppression. A combination of fat- and blood-suppressed $T_1$ mapping bears great promise for improved image quality and full elimination of partial-voluming caused by epicardial fat.

Reproducibility in myocardial $T_1$ mapping is paramount and affected by a number of factors, including the noise-resilience, the myocardial segment volume and the inter-observer reproducibility. On the one hand, reduced precision was shown for the proposed black-blood $T_1$ mapping technique compared with conventional SAPPHIRE. On the other hand, an increase in the readily evaluable myocardial area has been facilitated using blood-suppression, allowing for increased segmental sizes and potentially reducing the variability of segmental $T_1$ times.

Furthermore, the black-blood technique has shown high robustness towards variation of the ROI size. Yet, careful placement of the ROIs may be crucial for conventional $T_1$ mapping techniques, to exclude any areas of partial-voluming. As different ROI delineation may be a detrimental factor to inter-observer reproducibility, the increased robustness against ROI sizes, potentially decreases inter-observer variability.

The disclosure provides a novel imaging sequence for quantitative tissue characterization of the myocardium, while eliminating detrimental effects caused by the surrounding blood-pools. $T_1$ mapping is an emerging technique for quantitative myocardial tissue characterization that shows exceptional diagnostic and prognostic value in a plethora of ischemic and non-ischemic cardiomyopathies.

T1 mapping is commonly performed based on multiple 2D single-shot images, which are acquired during the limited end-diastolic quiescence period. This in turn hinders the in-plane resolution. In conventional T1 mapping methods, this leads to the creation of a border zone at the myocardium-blood interface, that contains signal contribution from both tissue types. This effect is called partial-voluming, and leads to significant corruption of the T1 time, due to substantial differences in the $T_1$ time between blood and myocardium.

A sequence is disclosed that employs a pulse train of velocity and shear sensitizing pulses, to suppress blood signal, in a myocardial $T_1$ mapping sequence. This allows for accurate assessment of myocardial $T_1$ time that is resilient to contaminating effects from the blood-pools.

The present disclosure has been described in terms of one or more embodiments, and it should be appreciated that many equivalents, alternatives, variations, and modifications, aside from those expressly stated, are possible and within the scope of the disclosure.

We claim:

1. A magnetic resonance imaging (MRI) system comprising:
    a magnet system configured to generate a polarizing magnetic field about at least a region of interest (ROI) in a subject arranged in the MRI system;
    a plurality of gradient coils configured to apply a gradient field to the polarizing magnetic field;
    a radio frequency (RF) system configured to apply an excitation field to the subject and acquire MR image data from the ROI;
    a computer system programmed to:
        control the RF system to apply a saturation pulse at a reference frequency that saturates a selected labile spin species of the subject;
        control the RF system to apply an inversion pulse after a variable delay;
        control the RF system and the plurality of gradient coils to apply a blood suppression preparation pulse;
        control the plurality of gradient coils to read imaging data during an acquisition time period; and
        reconstruct a T1 mapping image of the subject with black-blood contrast.

2. The MRI system of claim 1 wherein the blood suppression preparation pulse includes a motion sensitized driven equilibrium (MSDE) preparation pulse.

3. The MRI system of claim 2 wherein the computer system is programmed to perform a balanced Steady-State Free-Precession (bSSFP) imaging readout after applying the MSDE preparation pulse.

4. The MRI system of claim 3 wherein the MSDE preparation pulse comprises a non-selective 90° tip-down pulse, a series of one or more 180° refocusing pulses, and a final 90° tip-up pulse.

5. The MRI system of claim 2 wherein the MSDE preparation pulse has an echo time between 11 ms and 15 ms.

6. The MRI system of claim 2 wherein the MSDE preparation pulse comprises a rectangular 90° hard-pulses for tip-down and tip-up and a single 180° MLEV refocusing pulse.

7. The MRI system of claim 2 wherein the MSDE preparation pulse comprises a rectangular 90° hard-pulse for tip-down, an adiabatic 180° BIREF1 refocusing pulse and a composite (360°-270°) tip-up pulse.

8. The MRI system of claim 2 wherein the MSDE preparation pulse comprises a 0° degree three compartment BIR4 pulse, wherein the MSDE gradients are inserted symmetrically between the compartments.

9. The MRI system of claim 2 wherein the computer system is programmed to perform imaging at late end-diastole to accommodate the MSDE preparation well within the end-diastolic quiescence.

10. The MRI system of claim 1 wherein the blood suppression preparation pulse employs a pulse train of velocity and shear sensitizing pulses to suppress blood signal.

11. A method comprising:
    controlling, by a magnetic resonance imaging (MRI) system, a radio frequency (RF) system to apply a saturation pulse at a reference frequency that saturates a selected labile spin species of the subject;
    controlling the RF system to apply an inversion pulse after a variable delay;
    controlling the RF system and the plurality of gradient coils to apply a blood suppression preparation pulse;
    controlling the plurality of gradient coils to read imaging data during an acquisition time period; and
    reconstructing a T1 mapping image of the subject with black-blood contrast.

12. The method of claim 11 wherein the blood suppression preparation pulse includes a motion sensitized driven equilibrium (MSDE) preparation pulse.

13. The method of claim 12 further comprising:
performing a balanced Steady-State Free-Precession (bSSFP) imaging readout after applying the MSDE preparation pulse.

14. The method of claim 13 wherein the MSDE preparation pulse comprises a non-selective 90° tip-down pulse, a series of one or more 180° refocusing pulses, and a final 90° tip-up pulse.

15. The method of claim 12 wherein the MSDE preparation pulse has an echo time between 11 ms and 15 ms.

16. The method of claim 12 wherein the MSDE preparation pulse comprises a rectangular 90° hard-pulses for tip-down and tip-up and a single 180° MLEV refocusing pulse.

17. The method of claim 12 wherein the MSDE preparation pulse comprises a rectangular 90° hard-pulse for tip-down, an adiabatic 180° BIREF1 refocusing pulse and a composite (360°-270°) tip-up pulse.

18. The method of claim 12 wherein the MSDE preparation pulse comprises a 0° degree three compartment BIR4 pulse, wherein the MSDE gradients are inserted symmetrically between the compartments.

19. The method of claim 12 further comprising:
performing imaging at late end-diastole to accommodate the MSDE preparation well within the end-diastolic quiescence.

20. The method of claim 11 further comprising:
applying the blood suppression preparation pulse that employs a pulse train of velocity and shear sensitizing pulses to suppress blood signal.

\* \* \* \* \*

UNITED STATES PATENT AND TRADEMARK OFFICE
CERTIFICATE OF CORRECTION

PATENT NO. : 10,451,700 B2
APPLICATION NO. : 15/695259
DATED : October 22, 2019
INVENTOR(S) : Sebastian Weingartner et al.

It is certified that error appears in the above-identified patent and that said Letters Patent is hereby corrected as shown below:

In the Specification

Column 10, Line 38, "tan h/tan" should be --tanh/tan--.

Column 13, Line 18, "conventional" should be --conventional SAPPHIRE, as detailed in Table 1 below.--.

Column 13, Line 22, "of" should be --for--.

Signed and Sealed this
Third Day of December, 2019

Andrei Iancu
*Director of the United States Patent and Trademark Office*